(12) United States Patent
Drew

(10) Patent No.: US 7,237,020 B1
(45) Date of Patent: Jun. 26, 2007

(54) INTEGER PROGRAMMING TECHNIQUE FOR VERIFYING AND REPROVISIONING AN INTERCONNECT FABRIC DESIGN

(75) Inventor: Julie Ward Drew, Redwood City, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 747 days.

(21) Appl. No.: 10/290,643

(22) Filed: Nov. 8, 2002

Related U.S. Application Data

(63) Continuation-in-part of application No. 10/058,258, filed on Jan. 25, 2002.

(51) Int. Cl.
G06F 15/173 (2006.01)
G06F 11/00 (2006.01)
H04B 3/20 (2006.01)

(52) U.S. Cl. .................. 709/223; 370/217; 370/238; 370/391

(58) Field of Classification Search .................. None
See application file for complete search history.

(56) References Cited

U.S. PATENT DOCUMENTS

| | | |
|---|---|---|
| 4,920,487 A | 4/1990 | Baffes |
| 5,107,489 A | 4/1992 | Brown et al. |
| 5,113,496 A | 5/1992 | McCalley et al. |
| 5,138,657 A | 8/1992 | Colton et al. |
| 5,245,609 A | 9/1993 | Ofek et al. |
| 5,307,449 A | 4/1994 | Keiley et al. |
| 5,329,619 A | 7/1994 | Pagé et al. |
| 5,426,674 A | 6/1995 | Nemirovsky et al. |
| 5,524,212 A | 6/1996 | Somani et al. |
| 5,581,689 A | 12/1996 | Slominski et al. |
| 5,598,532 A | 1/1997 | Liron |
| 5,634,004 A | 5/1997 | Gopinath et al. |
| 5,634,011 A | 5/1997 | Auerbach et al. |
| 5,649,105 A | 7/1997 | Aldred et al. |

(Continued)

FOREIGN PATENT DOCUMENTS

WO WO-96/17458 A 6/1996

OTHER PUBLICATIONS

Ravindra K. Ahuja et al., Network Flows: Theory, Algorithms, and Applications, pp. 4-9, 649-686, 1993, Prentice-Hall, Upper Saddle River, NJ.

(Continued)

Primary Examiner—Wen-Tai Lin

(57) ABSTRACT

A technique for verifying and reprovisioning an interconnect fabric design using integer programming techniques. Requirements for the interconnect fabric design to be reprovisioned may be referred to as flow requirements. The flow requirements may include, for example, source and terminal nodes for communication flows and communication bandwidth required for the flows. An existing interconnect fabric design specifies an arrangement of elements of the fabric, such as links and interconnect devices. The invention programmatically verifies whether the existing design satisfies the flow requirements using integer programming techniques. If the existing design does not satisfy the flow requirements, the invention may also be used to reprovision the existing design to satisfy the flow requirements. If any flow(s) cannot be accommodated by the existing design, the integer programming techniques may also be used to identify links that can be added to accommodate the flow(s) Further, a new portion of interconnect fabric may be designed and added to the existing design to accommodate unassigned flows.

31 Claims, 20 Drawing Sheets

U.S. PATENT DOCUMENTS

| | | | |
|---|---|---|---|
| 5,651,005 A | 7/1997 | Kwok et al. | |
| 5,793,362 A | 8/1998 | Matthews et al. | |
| 5,805,578 A | 9/1998 | Stirpe et al. | |
| 5,815,402 A | 9/1998 | Taylor et al. | |
| 5,831,996 A | 11/1998 | Abramovici et al. | |
| 5,835,498 A | 11/1998 | Kim et al. | |
| 5,838,919 A | 11/1998 | Schwaller et al. | |
| 5,857,180 A | 1/1999 | Hallmark et al. | |
| 5,878,232 A | 3/1999 | Marimuthu | |
| 5,970,232 A | 10/1999 | Passint et al. | |
| 5,987,517 A | 11/1999 | Firth et al. | |
| 6,003,037 A | 12/1999 | Kassabgi et al. | |
| 6,031,984 A | 2/2000 | Walser | |
| 6,038,219 A | 3/2000 | Mawhinney et al. | |
| 6,047,199 A | 4/2000 | DeMarco | |
| 6,052,360 A | 4/2000 | Rogers | |
| 6,108,782 A | 8/2000 | Fletcher et al. | |
| 6,141,318 A * | 10/2000 | Miyao | 370/217 |
| 6,141,355 A | 10/2000 | Palmer et al. | |
| 6,148,000 A | 11/2000 | Feldman et al. | |
| 6,157,645 A | 12/2000 | Shobatake | |
| 6,195,355 B1 | 2/2001 | Demizu | |
| 6,212,568 B1 | 4/2001 | Miller et al. | |
| 6,253,339 B1 | 6/2001 | Tse et al. | |
| 6,331,905 B1 | 12/2001 | Ellinas et al. | |
| 6,345,048 B1 | 2/2002 | Allen et al. | |
| 6,363,334 B1 | 3/2002 | Andrews et al. | |
| 6,418,481 B1 | 7/2002 | Mancusi et al. | |
| 6,442,584 B1 | 8/2002 | Kolli et al. | |
| 6,452,924 B1 | 9/2002 | Golden et al. | |
| 6,526,420 B2 | 2/2003 | Borowsky et al. | |
| 6,539,027 B1 | 3/2003 | Cambron | |
| 6,539,531 B2 | 3/2003 | Miller et al. | |
| 6,557,169 B1 | 4/2003 | Erpeldinger | |
| 6,570,850 B1 | 5/2003 | Gutierrez et al. | |
| 6,594,701 B1 | 7/2003 | Forin | |
| 6,598,080 B1 | 7/2003 | Nagami et al. | |
| 6,603,769 B1 | 8/2003 | Thubert et al. | |
| 6,611,872 B1 | 8/2003 | McCanne | |
| 6,614,796 B1 | 9/2003 | Black et al. | |
| 6,625,777 B1 | 9/2003 | Levin et al. | |
| 6,628,649 B1 | 9/2003 | Raj et al. | |
| 6,633,909 B1 | 10/2003 | Barrett et al. | |
| 6,650,639 B2 | 11/2003 | Doherty et al. | |
| 6,668,308 B2 | 12/2003 | Barroso et al. | |
| 6,675,328 B1 | 1/2004 | Krishnarnachari et al. | |
| 6,687,222 B1 | 2/2004 | Albert et al. | |
| 6,694,361 B1 | 2/2004 | Shah et al. | |
| 6,697,334 B1 | 2/2004 | Klincewicz et al. | |
| 6,697,369 B1 | 2/2004 | Dziong et al. | |
| 6,697,854 B1 | 2/2004 | Glassen et al. | |
| 6,701,327 B1 | 3/2004 | Jones et al. | |
| 6,724,757 B1 | 4/2004 | Zadikian et al. | |
| 6,744,767 B1 | 6/2004 | Chiu et al. | |
| 6,757,731 B1 | 6/2004 | Barnes et al. | |
| 6,766,381 B1 | 7/2004 | Barker et al. | |
| 6,778,496 B1 | 8/2004 | Meempat et al. | |
| 6,804,245 B2 | 10/2004 | Mitchem et al. | |
| 6,857,027 B1 | 2/2005 | Lindeborg et al. | |
| 2002/0091804 A1 | 7/2002 | Ward et al. | |
| 2002/0091845 A1 | 7/2002 | Ward et al. | |
| 2002/0097680 A1* | 7/2002 | Liu et al. | 370/238 |
| 2002/0120770 A1 | 8/2002 | Parham et al. | |
| 2002/0122421 A1* | 9/2002 | Ambiehl et al. | 370/391 |
| 2002/0156828 A1 | 10/2002 | Ishizaki et al. | |
| 2002/0187770 A1* | 12/2002 | Grover et al. | 455/403 |
| 2002/0188732 A1 | 12/2002 | Buckman et al. | |
| 2003/0144822 A1 | 7/2003 | Peh et al. | |
| 2004/0010577 A1* | 1/2004 | Yegenoglu | 709/223 |
| 2005/0021583 A1 | 1/2005 | Andrzejak et al. | |
| 2005/0021831 A1 | 1/2005 | Andrzejak et al. | |
| 2005/0033844 A1 | 2/2005 | Andrzejak et al. | |

OTHER PUBLICATIONS

Julie Ward Drew et al., U.S. Appl. No. 10/290,760, filed Nov. 8, 2002.

Julie Ward Drew et al., U.S. Appl. No. 10/845,855, filed May 13, 2004.

Mathew Andrews et al., Integrated Scheduling of Unicast and Multicast Traffic in an Input-Queued Switch, 1999. < http://cm.bell-labs.com/cm/ms/who/andrews/infocom99switch.ps>.

Viraphol Chaiyakul, Assignment Decision Diagram for High-Level Synthesis, 1992.

Andre Dehon, Notes on Coupling Processors with Reconfigurable Logic, MIT Transit Project, Transit Note #118, 1995.

Cathy Fulton et al., Impact Analysis of Packet-Level Scheduling On an ATM Shared-Memory Switch, Infocom, vol. 3 pp. 947-954, 1998, IEEE, New York, NY.

Hiroshi Inose, An Introduction to Digital Integrated Communication Systems, pp. 87-89, 1979, Peter Peregrinus Ltd., Stevenage, United Kingdom.

A. Richard Newton, Interface-Based Design; Introduction, University of Caifornia at Berkeley, Apr. 1999.

Derek C. W. Pao, A Congestion Control Algorithm for Multipoint-to-Multipoint ABR Service in ATM Network, Proceedings of the IEEE Conference on High Performance Switching and Routing, pp. 167-175, Jun. 26, 2000, IEEE Press, New York, NY.

Rainer Schoenen et al., Weighted Arbitration Algorithms with Priorities for Input-Queued Switches with 100% Thoughput, 1999, <http://www.iss.rwth-aachen.de/Projekte/Theo/papers/Schoenen99bssw.ps.gz>.

Oryal Tanir et al., Structural Reuse In The Design Of ATM Switch Fabrics, 1997.

I. Widjaja et al., Performance Issues in VC-Merge Capable ATM LSRs, RFC 2682, Sep. 1999, The Internet Society, Reston, VA.

Joachim P. Walser, Solving Linear Pseudo-Boolean Constraint Problems with Local Search, 1997, American Association for Artificial Intelligence, Menlo Park, CA.

D. Klingman et al. Netgen: A Program for Generating Large Scale Capacitated Assignment, Transportation, and Minimum Cost Flow Network Problems, Management Science 20(5):814-821, 1974, The Institute Of Management Sciences, Providence, RI.

Dimitri P. Bertsekas, Linear Network Optimization: Algorithms and Codes, pp. 253-260, 1991, The MIT Press, Cambridge, MA.

Julie Ward et al., Storage Area Network Fabric Design, PowerPoint presentation given at the Math Sciences Research Institute for Combinatorial Design, Berkeley CA, Nov. 8, 2000.

Julie Ward et al., Storage Area Network (SAN) Fabric Design, PowerPoint presentation given at the INFORMS International Conference, Maui HI, Jun. 19, 2001.

Julie Ward et al., Storage Area Network (SAN) Fabric Design, PowerPoint presentation given at Berkeley, IEOR Department Seminar, Berkeley CA, Oct. 8, 2001.

Parameswaran Ramanathan et al., Resource Placement with Multiple Adjacency Constraints in k-ary n-Cubes, 1995.

Christodoulos A. Floudas et al., Quadratic Optimization, 1995.

U.S. Appl. No. 10/058,258, filed Jan. 25, 2002, Ward et. al.

U.S. Appl. No. 09/707,227, filed Nov. 6, 2000, Ward.

U.S. Appl. No. 09/968,437, filed Sep. 28, 2001, O'Sullivan et. al.

U.S. Appl. No. 10/027,564, filed Jun. 27, 2002, Ward et. al.

J. Ward, M. O'Sullivan, T. Shahoumian and J. Wilkes. Appia: automatic storage area network fabric design. Conference on File and Storage Technologies (FAST'02), pp. 203-217, Monterey, CA (USENIX, Berkeley, CA), Jan. 28-30, 2002.

S. Strand. Storage Area Networks and SANTK. Thesis Universiy of Minnesota, Dec. 2001.

M. O'Keefe, J. Diehl, K. Duncan, G. Heintz, J. Jones, S. McKenzie, J. Prusi, S. Strand, J. Wachholz. Designing Fibre Channel Storage Area Networks. www.borg.umn.edu/fc/papers/SANTK.pdf, file created in Feb. of 2001.

R. Fourer, D. Gay and B. Kernighan. AMPL: Modeling Language For Mathematical Programing with AMPL Plus 1.6 Student Edition for Microsoft Windows. Duxbery Press, Belmont, CA, 1997.

R. Fourer, D. Gay and B. Kernighan. AMPL: Modeling Language For Mathematical Programing. Boyd & Fraser Publishing Company, Danvers, MA, 1993.

R. Bixby. Solving Real-World Linear Programs: A Decade and more of Progress, Operations Research, vol. 50, No. 1, Jan.-Feb. 2002, pp. 3-15.

R. K. Ahuja, T. L. Magnanti, J. B. Orlin. Network Flows: Theory, Algorithims, and Applications. Prentice Hall, 1993, pp. 4-9, 649-686.

S. Strand. Automatic Generation of Core/Edge Topology SANs Using SANTK. May 23, 2002.

* cited by examiner

INTEGER PROGRAMMING TECHNIQUE FOR VERIFYING AND REPROVISIONING AN INTERCONNECT FABRIC DESIGN

This application is a continuation-in-part of U.S. application Ser. No. 10/058,258, filed Jan. 25, 2002, the entire contents of which are hereby incorporated by reference.

This application is related to U.S. application Ser. No. 10/290,760, filed, Nov. 8, 2002, and entitled "REPROVISIONING TECHNIQUE FOR AN INTERCONNECT FABRIC DESIGN," the entire contents of which are hereby incorporated by reference.

FIELD OF THE INVENTION

The present invention relates to the field of networks. More particularly, this invention relates to verification and reprovisioning of designs for networks.

BACKGROUND OF THE INVENTION

An interconnect fabric provides for communication among a set of nodes in a network. Communications originate within the network at a source node and terminate at a terminal node. Thus, a wide variety of networks may be viewed as a set of source nodes that communicate with a set of terminal nodes via an interconnect fabric. For example, a storage area network may be arranged as a set of computers as source nodes which are connected to a set of storage devices as terminal nodes via an interconnect fabric that includes communication links and devices such as hubs, routers, switches, etc. Devices such as hubs, routers, switches, etc., are hereinafter referred to as interconnect devices. Depending on the circumstances, a node may assume the role of source node with respect to some communications and of terminal node for other communications. In some instances, a node may play a source or destination role (or both) and act as an internal interconnect device.

The communication requirements of an interconnect fabric may be characterized in terms of a set of flow requirements. A typical set of flow requirements specifies the required communication bandwidth from each source node to each terminal node. The design of an interconnect fabric usually involves selecting the appropriate arrangement of physical communication links, interconnect devices, and related components that will meet the flow requirements.

Once a design of an interconnect fabric has been obtained, it may be desired to reprovision the design to meet communication requirements other than those for which the design was originally developed. For example, the communication requirements for a design may change over time. In addition, it may be desired to use an existing interconnect fabric design for a different application. Prior methods for reprovisioning an interconnect fabric design based on manual techniques are usually error prone and time-consuming.

Therefore, what is needed is an improved technique for reprovisioning the design of a network. It is to these ends that the present invention is directed.

SUMMARY OF THE INVENTION

A technique is disclosed for verifying and reprovisioning an interconnect fabric design for interconnecting a plurality of network nodes. A design for the interconnect fabric specifies an arrangement of elements of the fabric and flow requirements among the network nodes. The invention programmatically reprovisions the design.

In one aspect, a computer implemented method for verifying and reprovisioning an initial design for an interconnect fabric is provided. An integer programming problem is initialized with the initial design including an arrangement of interconnect elements for interconnecting a plurality of network nodes and with requirements for a plurality of flows among the network nodes. The integer programming problem is solved thereby forming a plurality of solutions, wherein in each solution, one or more of the flows is assigned to a path in the initial design. A solution is selected according to an objective of maximizing assignment of flows to paths in the initial design.

A solution may be selected according to a cost minimization objective. The solution may be selected according to a weighted combination of maximizing assignment of flows and cost. A least-cost solution may be selected from among a plurality of solutions selected according to the objective of maximizing assignment of flows to the initial design.

Communication links may be added or removed from the design. A new portion of the interconnect fabric may be added to the initial design where one or more flows cannot be accommodated by said initial design. Any flow not assigned to a valid path in the initial design may be assigned to a placeholder device, in which case, the new portion replaces the placeholder device.

At least one flow may be assigned partially to the initial fabric design and partially to the new portion. An interconnect device of the initial design may be recast as a source or terminal node for at least one of the partially assigned flows. A dummy node may be added where the dummy node serves as a source node when the recast interconnect device serves as a terminal node and the dummy node serves as a terminal node when the recast interconnect device serves as a source node.

Other features and advantages of the present invention will be apparent from the detailed description that follows.

BRIEF DESCRIPTION OF THE DRAWINGS

The present invention is described with respect to particular exemplary embodiments thereof and reference is accordingly made to the drawings in which.

DETAILED DESCRIPTION OF A PREFERRED EMBODIMENT

The present invention is a technique for verifying and reprovisioning an interconnect fabric design using integer programming techniques. Requirements for the interconnect fabric design to be reprovisioned may be referred to as flow requirements. The flow requirements may include, for example, source and terminal nodes for communication flows and communication bandwidth required for the flows. An existing interconnect fabric design specifies an arrangement of elements of the fabric, such as links and interconnect devices. The invention programmatically verifies whether the existing design satisfies the flow requirements using integer programming techniques. If the existing design does not satisfy the flow requirements, the invention may also be used to reprovision the existing design to satisfy the flow requirements. If any flow(s) cannot be accommodated by the existing design, the integer programming techniques may also be used to identify links that can be added to accommodate the flow(s). Further, a new portion of interconnect fabric may be designed and added to the existing design to accommodate unassigned flows. As a result, the design is efficiently and cost-effectively reprovisioned to meet the flow requirements.

The technique is applicable to any network in which communications originate at a source node and terminate at a terminal node, including networks in which a node assumes the role of source node with respect to some communications, the role of terminal node for other communications and/or the role of interconnect device for some communications. As a particular example, a storage area network (SAN), such as a fibre-channel SAN, may be arranged as a set of computers as source nodes which are connected to a set of storage devices as terminal nodes via an interconnect fabric that includes communication links (e.g., fibres) and devices such as hubs, routers, switches, port adapters (e.g., Fibre Channel to PCI), etc.

Because the technique is systematic, it is adaptable to be executed by a computer. Thus, much larger design problems can be solved than can be solved by hand. The technique can be used to reprovision existing fabric designs efficiently and cost-effectively.

Figure 1:
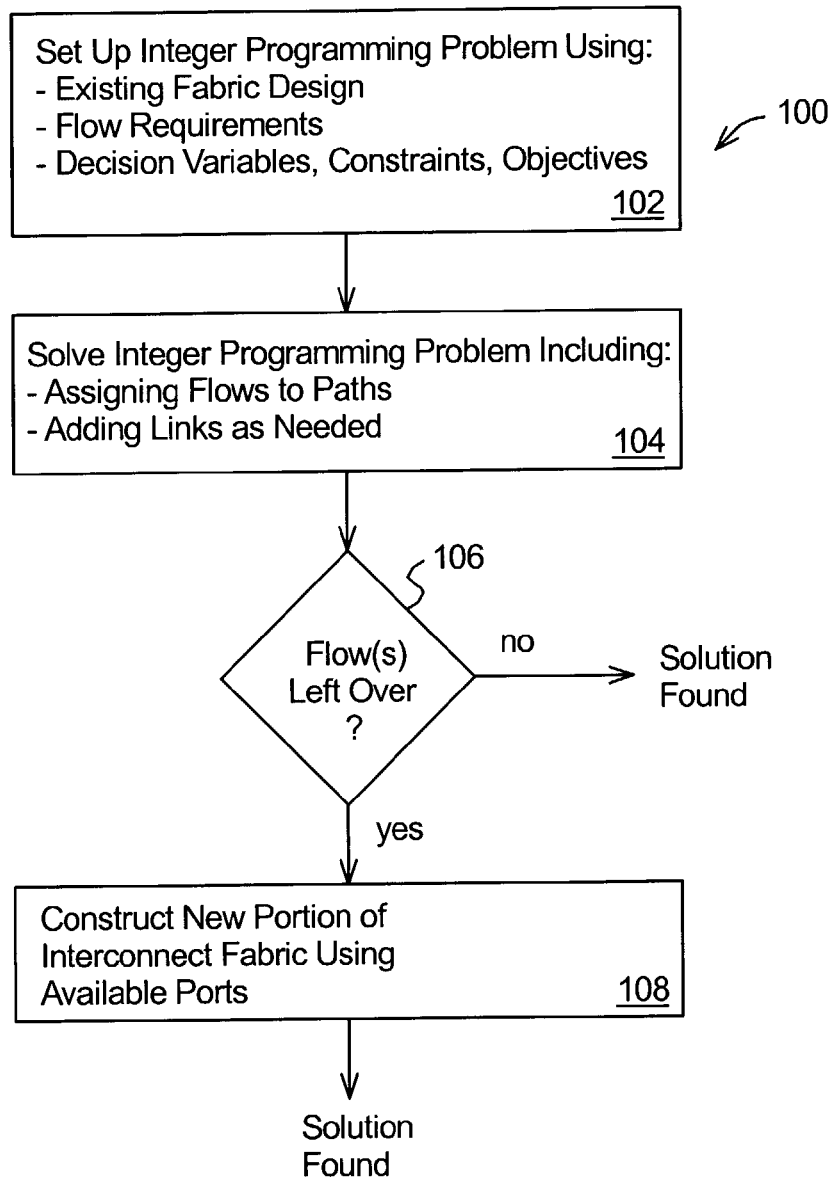
FIG. 1 shows a method of verifying and reprovisioning a design for an interconnect fabric using integer programming techniques in accordance with an aspect of the present invention.

FIG. 1 shows a method 100 for reprovisioning a design for an interconnect fabric in accordance with an aspect of the present invention. The method 100 receives as input a specification of an existing design for an interconnect fabric and a set of flow requirements to be supported by the design. Typically, the design specifies at least a set of interconnect devices and communication links. The devices may include for example, hubs, routers, switches, and so forth. The links form physical connections among the nodes and the interconnect devices. These may include, for example, fiber optic links, fibre channel links, wire-based links, and links such as SCSI, as well as wireless links. For example, U.S. application Ser. No. 09/707,227, filed Nov. 6, 2000, the contents of which are hereby incorporated by reference, discloses a technique for designing interconnect fabrics using a set of nodes and flow requirements as a starting point. It will be apparent, however, that the present technique may be used to reprovision interconnect fabric designs obtained by other techniques, such as manual or other methods.

Figure 2:
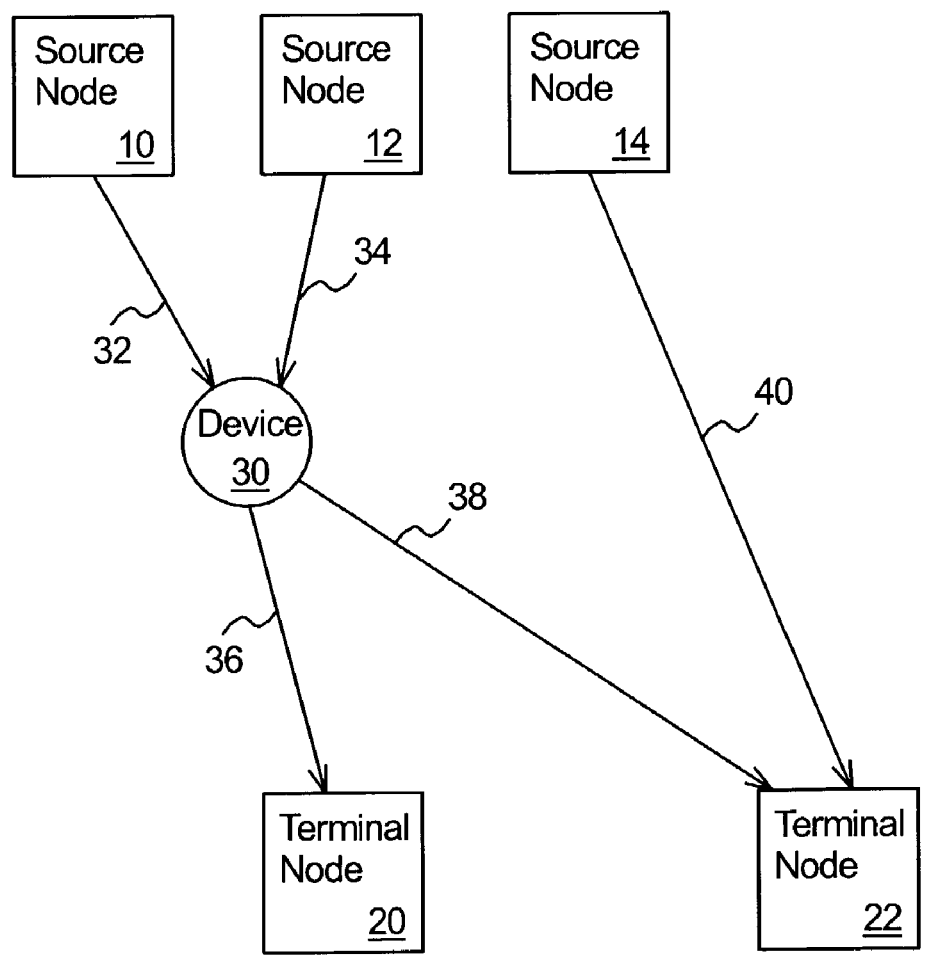
FIG. 2 shows an exemplary design specification for an interconnect fabric to be reprovisioned according to the present invention.

FIG. 2 shows an exemplary design specification for an interconnect fabric to be reprovisioned according to the present invention. As shown in FIG. 2, source nodes 10, 12 and 14 communicate with terminal nodes 20 and 22 via an interconnect device 30 and communication links 32, 34, 36, 38 and 40. More particularly, source node 10 is coupled to device 30 via link 32. Source node 12 is coupled to device 30 via link 34. Device 30 is coupled to terminal node 20 via link 36 and to terminal node 22 via link 38. Source node 14 is coupled to terminal node 22 via link 40.

In addition, the method 100 receives a set of flow requirements that are to be supported by the fabric. These will generally be a different or changed set of flow requirements from those that the interconnect fabric was originally designed to support. Table 1 shows an example set of flow requirements for an interconnect fabric design.

TABLE 1

|  | Terminal Node 20 | Terminal Node 22 |
|---|---|---|
| Source Node 10 | a | b |
| Source Node 12 | c | — |
| Source Node 14 | — | d |
| Source Node 16 | e | f |
| Source Node 18 | — | g |

The flow requirements in this example specify five source nodes (source nodes 10-18 in the figures below) and two terminal nodes (terminal nodes 20-22 in the figures below). For the interconnect fabric design to meet the flow requirements, it must contain communication paths between all pairs of the source nodes 10-18 and terminal nodes 20-22 having positive flow requirements and must have sufficient bandwidth to support all of the flow requirements simultaneously.

In one embodiment, the source nodes 10-18 are host computers and terminal nodes 20-22 are storage devices and the bandwidth values for flows a-g are numbers expressed in units of megabits per second. Thus, the interconnect fabric design may be for a storage area network.

In other embodiments, there may be multiple flow requirements between a given source and terminal node pair. In such embodiments, the cells of Table 1 may contain a list of two or more entries.

Figure 3:
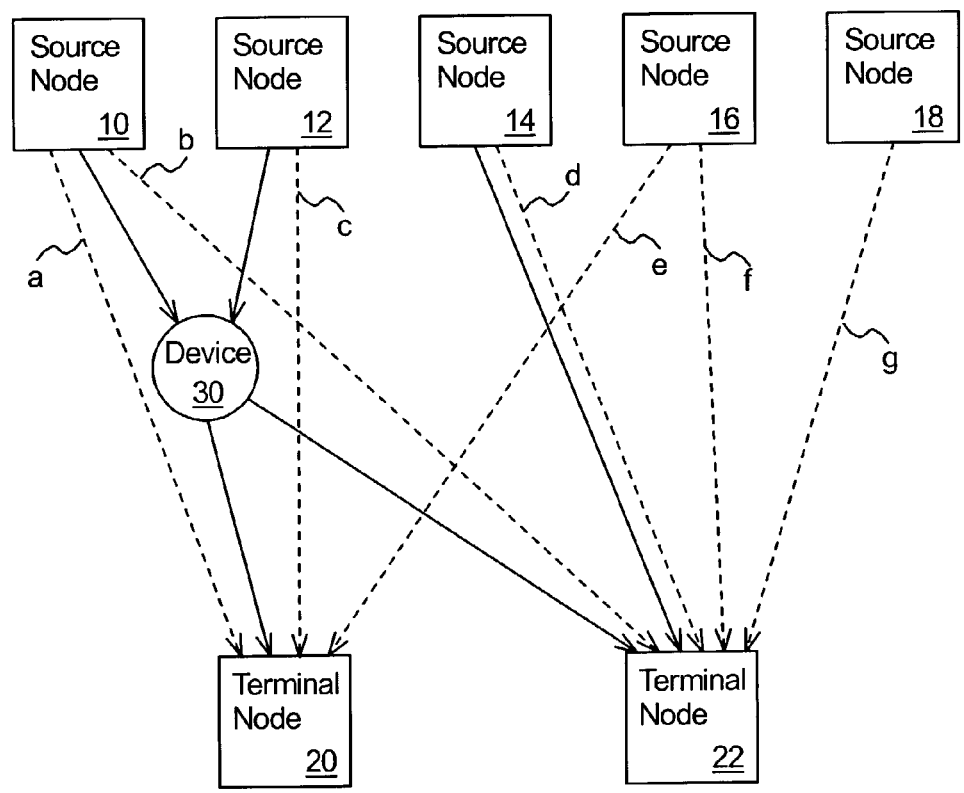
FIG. 3 shows the exemplary design specification of FIG. 2 along with a new set of flow requirements to be supported by a reprovisioned design for the interconnect fabric.

FIG. 3 shows the exemplary design specification of FIG. 2 along with the new set of flow requirements of Table 1. These flow requirements are to be supported by a reprovisioned design for the interconnect fabric. As shown in FIG. 3, a flow a forms a connection between the source node 10 and the terminal node 20, a flow b forms a connection between the source node 10 and the terminal node 22, a flow c forms a connection between the source node 12 and the terminal node 20. In addition, a flow d forms a connection between the source node 14 and the terminal node 22, a flow e forms a connection between the source node 16 and the terminal node 20, a flow f forms a connection between the source node 16 and the terminal node 22, and a flow g forms a connection between the source node 18 and the terminal node 22.

Because the set of nodes and the flow requirements are the basic constraints for the interconnect fabric, they may be used as a starting point for reprovisioning the design. For example, the set of nodes and the flow requirements may be indicated by the applications that the design to be reprovisioned is intended to support. Some of this information may be obtained, for example, from the existing design with the remainder determined based on changes to the workload that is to be supported by the reprovisioned design. Accordingly, the set of nodes and flow requirements will generally be readily available.

In step 102 of the method 100 of FIG. 1, an integer programming problem is initialized with the existing interconnect fabric design and the flow requirements to be supported by the design. Integer programming is used to attempt to assign each flow of the new flow requirements to a valid and feasible path in the existing interconnect fabric design. To be a valid path for a flow, the path should start at the source node for the flow, terminate at the end node for the flow and pass through a contiguous subset of the links and devices. A feasible assignment of a flow to a path is one in which no constraints on elements in the fabric are violated (e.g., no bandwidth capacities are exceeded).

The integer programming problem is initialized in terms of decision variables, constraints, and objectives. The decision variables include whether or not a flow F, is to be assigned to a particular interconnect element, such as link L or an interconnect device. Thus, for example, each possible combination of a flow and link given as {F, L} represents a decision variable. A value of one may be assigned to such a decision variable to indicate the flow is assigned to the link or a value of zero may be assigned to indicate the flow is not assigned to the link. Another decision variable may be whether or not a new link is to be added between a pair of available (i.e. open) ports. Possible available ports may be on a node or interconnect device. Another decision variable may be whether to remove an existing link in the design.

Also, as explained in more detail herein, decision variables may be associated with a placeholder device that may be added to the interconnect fabric design to accommodate some of the flow requirements. During integer programming steps of the method 100, the placeholder device serves as a surrogate for a new portion of the interconnect fabric that may be added to the existing design. The new portion then replaces the placeholder device after a solution to the integer programming has been found. For purposes of integer programming, the placeholder device is functionally equivalent to a switching device that has an unlimited port count and unlimited bandwidth. The decision variables corresponding to the placeholder device identify communication links between the existing fabric elements and the placeholder device and flows to be routed along those links.

The constraints for the integer programming problem initialization include a requirement that a flow can only be assigned to a set of links and devices that form a valid path for the flow (or to a path that would become a valid path for the flow by the addition of one or more links). The constraints also include maximum bandwidth constraints, such as bandwidth constraints on communication links, on ports of interconnect devices and on ports of nodes. Thus, a flow cannot be assigned to a path if the assignment would violate a bandwidth or other constraint on any of the links or devices in the path, even where the path is a valid path for the flow. To determine whether a bandwidth constraint for a network resource is violated, the bandwidth requirements for all flows that utilize the resource are aggregated.

A constraint for adding links is the number of ports available at the node or device that terminates each end of the link, since each link to be added requires an open port at each of its ends. Thus, for adding a link to accommodate a flow, a pair of available ports is selected. The pair of available ports includes an available port at the source node for the flow, or a port that is reachable from the source node for the flow via links and/or devices, and an available port at the terminal node for the flow, or one that is reachable from the terminal node for the flow via links and/or devices.

The objectives include maximizing the assignment of flows (e.g., by number of flows, total bandwidth assigned, or a combination of both) to valid and feasible paths in the existing interconnect fabric and may also include minimizing cost. Taking both of these objectives into account may be accomplished, for example, by first identifying multiple solutions to the integer programming problem for which assignment of flows to the existing design is maximized and then selecting a least-cost solution from among the multiple solutions that result in a high assignment of flows. As an alternative, multiple solutions may be identified that for which cost is minimized and then one, for which flow assignment is highest, may be selected from among them. Alternately, a weighted sum that includes components of each may be maximized, e.g., (a f(x)+b g(x)) where a and b are multiplicative weights on the functions f and g and the functions f and g relate to assignment of flows and cost, respectively. The objective having a higher priority can be indicated by the chosen weights. For example, if the weight a is much larger than b, a solution x* may be found that maximizes f(x), and among all of those that maximize f(x), has the maximal value for g(x). However, x* is likely to be different from the optimal x' that maximizes g(x).

Cost is incurred by the addition of links and may also take into account the length of any added link. Thus, cost may be minimized by minimizing the number of added links and possibly their lengths. It is generally preferred to incur the cost of adding a link to accommodate a flow as opposed to leaving a flow unassigned (or assigning the flow to the placeholder device). Cost may also include a cost penalty associated with removing a link. Also, a cost may be assigned to the total number of ports used on the placeholder device and/or the bandwidth of flows routed through it.

The actual costs assigned may be obtained through statistical techniques based on the costs of implementing actual designs. For example, for the placeholder device, actual costs may be determined statistically for designs that have various numbers of connections to the outside world (corresponding to the required number of ports on the placeholder device) and various bandwidth capacities (corresponding to the bandwidth capacity required of the placeholder device). Thus, an approximate cost of the reprovisioned interconnect fabric design may be based on the port cost for the placeholder device and the total number/volume of required flows required of the placeholder device and may also be based on the cost of any added links. Where the placeholder device is used, the objectives may omit maximizing assignment of flows to the initial design. This is because all of the flows will be assigned to either the initial design or to the placeholder device and the cost minimization objective will tend to favor assignment of flows to the initial fabric design.

Thus, the decision variables, constraints and objectives define a search space within which any and all solutions to the integer programming problem can be found.

In step 104 the integer programming problem is solved. This is accomplished by an exhaustive search of the search space for solutions that do not violate any of the constraints. Each solution is represented as a set of values for the decision variables. Thus, each solution specifies flows that are assigned to paths in the initial interconnect fabric. A path may include one or more newly-added links or may be routed through the placeholder device. Thus, a solution also specifies which links have been added, which links have been removed and the requirements of the placeholder device. A solution is selected in step 104 that optimizes the objectives.

Steps 102 and 104 may be performed by using a commercially available modeling language, such as AMPL available from AMPL Software Pty. Ltd. of Turramurra, Australia and a commercially available integer programming solver, such as CPLEX available from ILOG S.A. of Gentilly, France. It will be apparent, however, that a different modeling language and/or solver may be used.

Figure 4:
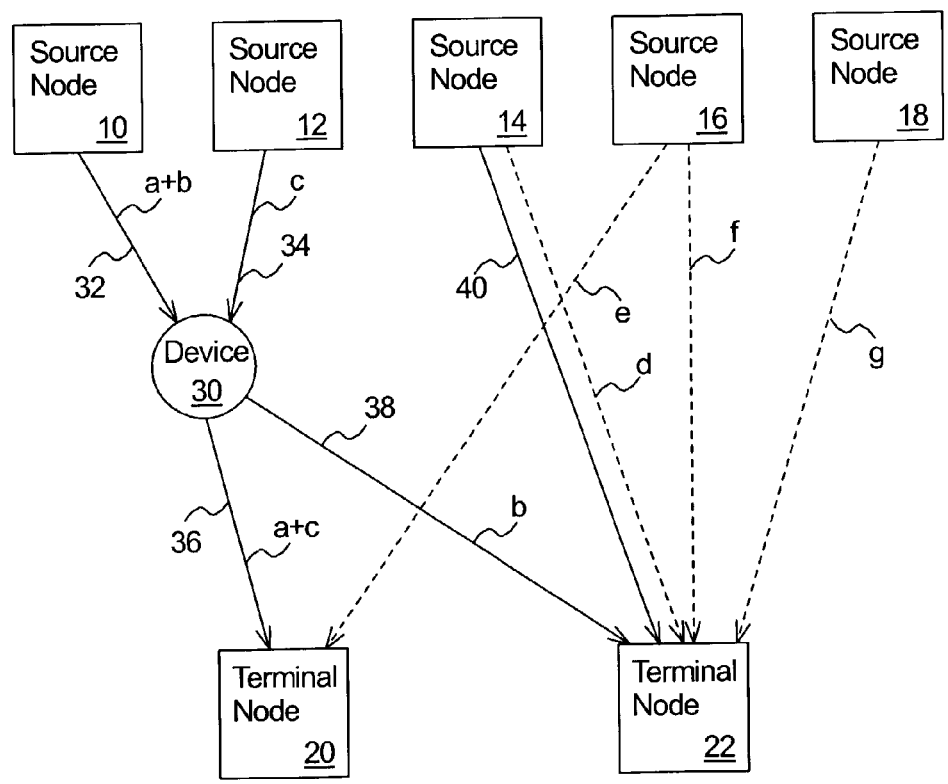
FIG. 4 shows an exemplary assignment of some of the flow requirements of FIG. 3 to the existing interconnect fabric design of FIG. 2 according to an aspect of the present invention.

FIG. 4 shows an exemplary assignment of some of the flow requirements of FIG. 3 to the existing interconnect fabric design of FIG. 2 as a result of solving the integer programming problem in step 104. As shown in FIG. 4, flow a is assigned to link 32, device 30 and link 36; flow b is assigned to link 32, device 30 and link 38; and flow c is assigned to link 34 device 30 and link 36.

Flows d, e, f, and g remain unassigned. Flows e and f may remain unassigned because the existing interconnect fabric does not provide a path from the source node 16. Further, the flows d and g (and f) may remain unassigned assuming the terminal node 22 has only two ports. As such, the terminal node 22 cannot simultaneously accommodate links 38 and 40 and the at least one more link that will be needed for the flows d, f and g. Thus, the link 40 is a candidate for removal from the design.

Note that in the example, the link 38 or the link 40 may be removed from the design to relieve the port unavailability condition at node 22. If link 38 is removed, then flow b will become unassigned since it is currently assigned to link 38. However, if link 40 is removed, then flow d will become unassigned since it is currently assigned to the link 40. Thus, removal of the link 40 may be preferred assuming the flow b has a higher bandwidth than flow d since this results in a higher volume of assigned flows. In other circumstances, removal of one link over another may be preferred if it results in a higher number of assigned flows.

FIG. 4 illustrates a possible solution to the integer programming problem in which no new links have been added. Thus, in one embodiment, the integer-programming problem may be constrained such that links are not added to the fabric design. Rather, all of the unassigned flows can be accommodated by constructing a new portion of the fabric as in step 108, explained below.

Figure 5:
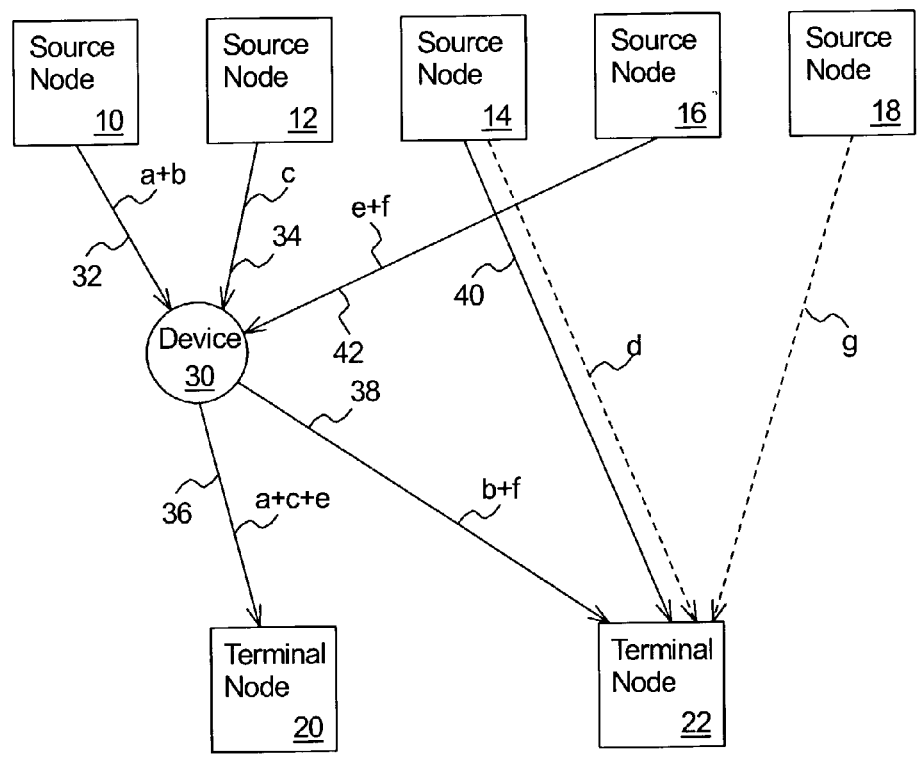
FIG. 5 shows the exemplary interconnect fabric design to which a link has been added according to an aspect of the present invention.

In another embodiment, one or more links may be added during the integer programming steps 102 and 104. FIG. 5 shows the exemplary interconnect fabric design to which a link 42 has been added between the node 16 and the device 30. Thus, FIG. 5 illustrates a possible solution to the integer programming problem assuming that the addition of new links is allowed and at least one port was available at the node 16 and at least one port was available at the device 30 to accommodate the link 42. As shown in FIG. 5, the flows e and f are assigned to the link 42 and to device 30. In addition, flow e is assigned to link 36 and flow f is assigned to link 38. Again, assuming that the terminal node 22 has only two ports, the flows d and g may remain unassigned while link 40 is a candidate for removal.

Note that it may have been possible to add links other than the link 42. For example, a link may have been added between the source node 16 and the terminal node 20 for accommodating the flow e, assuming a port with sufficient bandwidth capacity was available at each of the nodes 16 and 20. However, only one of the remaining flows (i.e. the flow e) would have been assigned to such a link. Accordingly, the link 42 is preferred because two flows (i.e. flows e and f) were able to be assigned to the link 42 assuming no bandwidth constraint is violated by the assignment. All possibilities are preferably identified during the integer programming solution step 104, but the solution is selected in which the objectives are optimized. Accordingly, the solution may be selected in which the link 42 is added.

The design of FIG. 5 may be referred to as "link-augmented" since any links which may be added to accommodate previously unassigned flows have been added to the design.

Once an attempt has been made to assign each flow to the existing design though integer programming (steps 102 and 104), a determination is made in a step 106 (FIG. 1) as to whether all the flow requirements are successfully assigned to the fabric design. If all of the flows have been assigned to valid paths in the existing fabric design without exceeding the capacities of the corresponding elements of the network design, then this indicates that further modification of the design is not required in order to support the new flow requirements.

Thus, in another example, assume that the flow g was not included in the flow requirements. Under these circumstances, the entire flow requirements can be assigned to the link-augmented design (since flow d could be assigned to the link 40, in which case, the flow g was the only unassigned flow of the prior example). Thus, the method 100 of FIG. 1 may terminate in step 106 with a successfully reprovisioned design after a no remaining flows determination in step 106.

In the prior example, however, the flows d and g remain unassigned. Thus, in circumstances where one or more flows remain unassigned, these flows are held over so that modifications can be performed to the interconnect fabric for supporting them. If flows are held over, the determination in step 106 is that there are remaining flows.

Thus, a technique has been described in which integer programming techniques are used to verify whether an existing interconnect fabric can accommodate a set of flow requirements.

Figure 6:
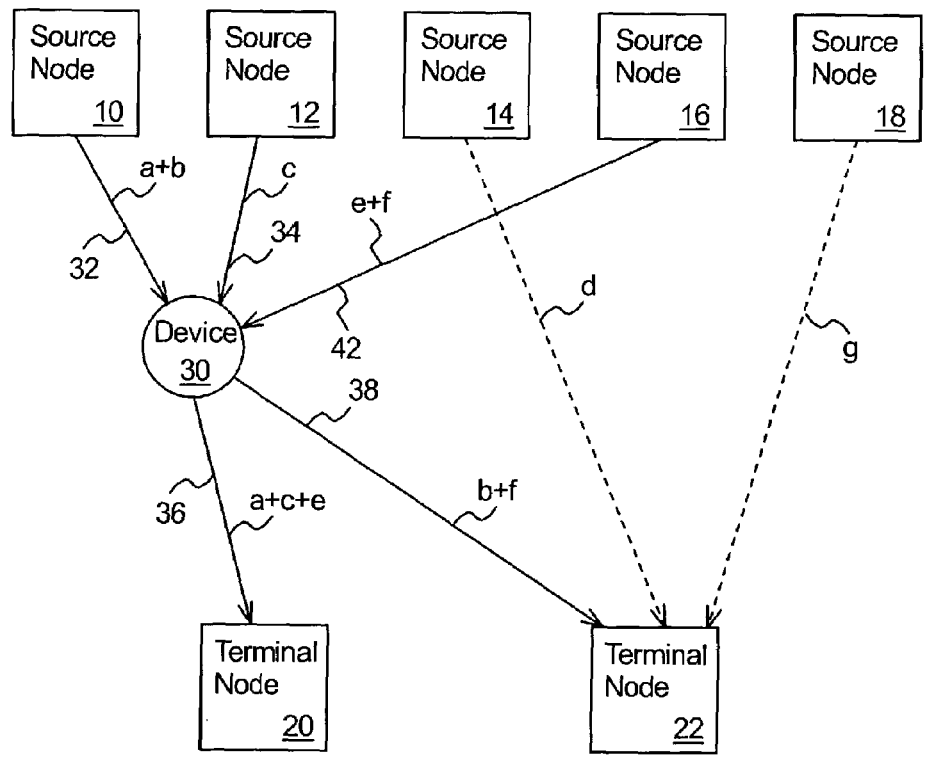
FIG. 6 shows the exemplary interconnect fabric design from which a link has been removed according to an aspect of the present invention.

FIG. 6 shows the exemplary interconnect fabric design from which the link 40 has been removed. FIG. 6 also shows flow d and flow g, which are unassigned. Assume that node 18 has at least one port. Thus, a port is now available at each of nodes 14, 18 and 22 for accommodating the flows d and g. As mentioned, the addition of links only is not feasible for accommodating these flows simultaneously, since two links would be required and the node 22 does not have a sufficient number of available ports.

In step 108 of the method 100 (FIG. 1), a new portion of interconnect fabric is constructed in order to accommodate the unassigned flows. This new portion of fabric will then be added to the existing link-augmented fabric to form a reprovisioned fabric that accommodates the entire flow requirements.

Figure 7:
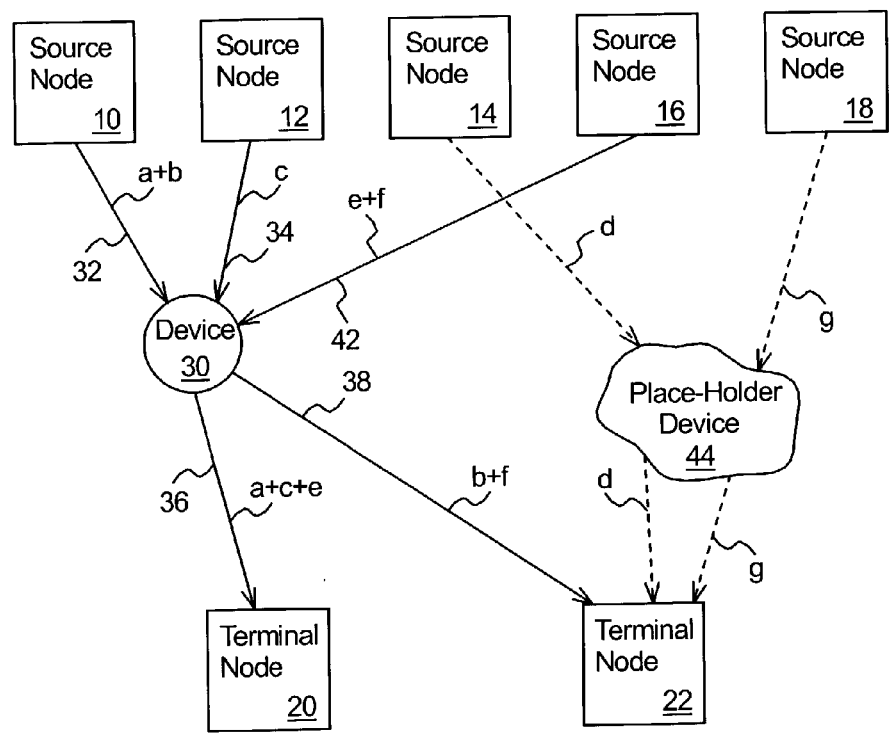
FIG. 7 shows the exemplary interconnect fabric design to which a new portion of interconnect fabric is to be added according to an aspect of the present invention.

The solutions of FIGS. 4, 5 and 6 were achieved without using a placeholder device. However, in a preferred embodiment, the placeholder device is utilized as an entity of the fabric design in steps 102 and 104. FIG. 7 shows an exemplary solution including a link-augmented existing interconnect fabric design and a placeholder device 44 of interconnect fabric. As mentioned, flows that are not assigned to the existing fabric design are instead assigned to the placeholder device 44. Thus, in the example, flows d and g are assigned to the placeholder device 44.

As mentioned, use of the placeholder device advantageously provides for optimization of costs by associating costs with the assignment of flows to the placeholder device. In addition, the placeholder device advantageously ensures that ports are available in the existing fabric design for accommodating the flows that are routed through the placeholder device. In the example, the routing of flows d and g through the placeholder device 44 requires at least one port at the terminal node 22 (and, thus, the link 40 is removed from the solution of FIG. 7).

In step 108 the new portion of interconnect fabric replaces the placeholder device 44. In one aspect, the new portion of the design for replacing the placeholder device 44 (or for accommodating the unassigned flows of FIGS. 4, 5, and 6) is developed from scratch. Any of a number of programmatic techniques may be utilized to design the new portion of the fabric in step 108. For example: U.S. application Ser. No. 09/707,227, filed Nov. 6, 2000; U.S. application Ser. No. 09/968,437, filed Sep. 28, 2001; and U.S. application Ser. No. 10/027,564, filed, Dec. 19, 2001, the contents of each of which are hereby incorporated by reference, each disclose a technique for designing interconnect fabrics that can be computer-implemented and that uses a set of nodes and flow requirements as a starting point.

For step 108, the placeholder device provides all of the connection points for the new portion of the interconnect fabric design. This is because the decision variables corresponding to the placeholder device identify communication links between the existing fabric elements and the placeholder device and flows to be routed along those links. Accordingly, all of the flow entry and exit points for the new portion are identified.

Further, a physical embodiment of the original design may be assumed to be available. Thus, for developing the new portion in step 108, it may be desired to reuse physical elements of the existing network in order to reduce the cost of reprovisioning the network. Thus, a cost may be assigned to each of various elements available for inclusion in the new portion of the design. When selecting from two or more possible options for the design having different costs, the lower cost of the options may then be selected in an effort to reduce the cost of the overall design. In the example, the link 40 which was designated a candidate for removal may be reused in step 108, if practical. Further, U.S. application Ser. No. 10/027,564, filed Dec. 19, 2001, and incorporated herein by reference, discloses a programmatic technique for designing interconnect fabrics in which cost of fabric elements may be taken into account when designing the network. In addition, U.S. application Ser. No. 09/968,437, filed Sep. 28, 2001, and incorporated herein by reference, discloses a programmatic technique for designing interconnect fabrics in which cost of modules accounts for the relative cost of links, hubs and switches and in which modules are built by low-cost selection. Thus, in the designing step 108, a lower cost (e.g., zero cost) may be assigned to interconnect devices or links existing in the original fabric design than to alternates not included in the design. As a result, the elements existing in the design will tend to be favored over other elements not included in the design, thereby tending to reduce the cost of the reprovisioned network design by reusing the devices.

Figure 8:
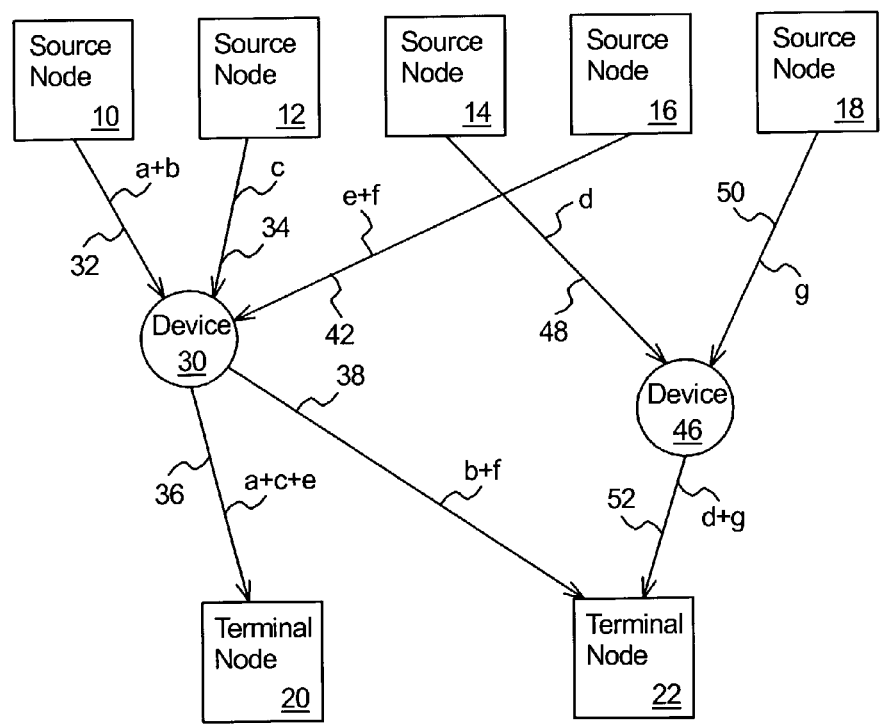
FIG. 8 shows the exemplary interconnect fabric design including a newly-added portion of interconnect fabric according to an aspect of the present invention.

FIG. 8 shows the exemplary interconnect fabric design as a result of performing step 108 in which the newly-added portion of interconnect fabric includes an interconnect device 46 and links 48, 50 and 52 for accommodating the flows d and g. More particularly, source node 14 is connected to device 46 by link 48; source node 18 is connected to device 46 by link 50; and device 46 is connected to terminal node 22 by link 52. Flow d is assigned to link 48, device 46 and link 52, while flow g is assigned to link 50, device 46 and link 52.

In some cases, the flow requirements may specify a source or a terminal node that does not correspond to any paths in the initial interconnect fabric design. As in the example, the flow requirements of Table 1 specify five source nodes, whereas, the existing design was for three source nodes. When this occurs, a source or a terminal node may be added to the design. For example, if a source node from which a flow is to originate cannot be identified, a new source node having at least one port with sufficient bandwidth for accommodating the flow may be added to the design. Similarly, where a terminal node for flow cannot be identified, a new terminal node having at least one port with sufficient bandwidth for the flow may be added to the design.

Thus, a technique has been described in which an original interconnect fabric design is reprovisioned for accommodating a new set of flow requirements. This is accomplished while minimizing cost by reusing elements of the existing fabric to the extent that it is practical to do so. In the example above, each flow is assigned the existing fabric or to the newly-added portion without any flows crossing between the existing design and the newly-added portion. In other examples, a flow may extend between the existing design and the newly-added portion.

Figure 9:
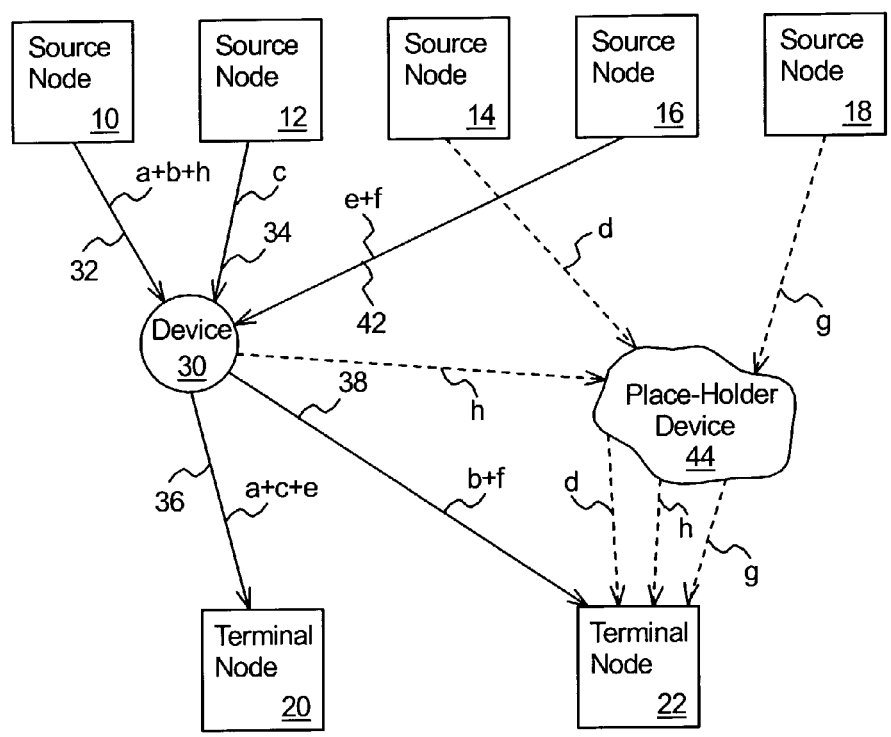
FIG. 9 shows an exemplary design specification for an interconnect fabric along with an alternate new set of flow requirements to be supported by a reprovisioned design for the interconnect fabric according to an aspect of the present invention.

FIG. 9 shows the exemplary design specification for an interconnect fabric along with an alternate set of flow requirements to be supported by a reprovisioned design for the interconnect fabric. The existing interconnect fabric design in FIG. 9 is the same as that of FIG. 3, however, the flow requirements differ in that flow h is added. The flow h connects source node 10 with terminal node 22. Integer programming steps 102 and 104 of the method 100 (FIG. 1) are thus performed based on these new flow requirements (and on the existing fabric design specification). In the solution to the integer programming problem as shown in FIG. 9, the flow h is partially assigned to the existing fabric design and partially assigned to the placeholder device 44. More particularly, the flow h is assigned to the link 32 and to the device 30 which form a path for the flow, but not a valid path since it does not terminate the terminal node for the flow. Assume, however, that the flow h cannot be assigned to the link 38 since this would violate a constraint (e.g., a bandwidth constraint) and that an available port can be found on the device 30. Thus, the flow h is connected from the device 30 to the placeholder device 44 and from the placeholder device 44 to the terminal node 22.

It may be desired as a starting point for construction of the new portion of the interconnect fabric (as in step 108) that the flows all originate at a source node and terminate at a terminal node. For example, the techniques described in U.S. application Ser. No. 09/707,227, filed Nov. 6, 2000; U.S. application Ser. No. 09/968,437, filed Sep. 28, 2001; and U.S. application Ser. No. 10/027,564, filed, Dec. 19, 2001, generally have this as a requirement. Because for purposes of constructing the new portion of fabric, the flow h originates at interconnect device 30, it does not originate at a source node.

Figure 10:
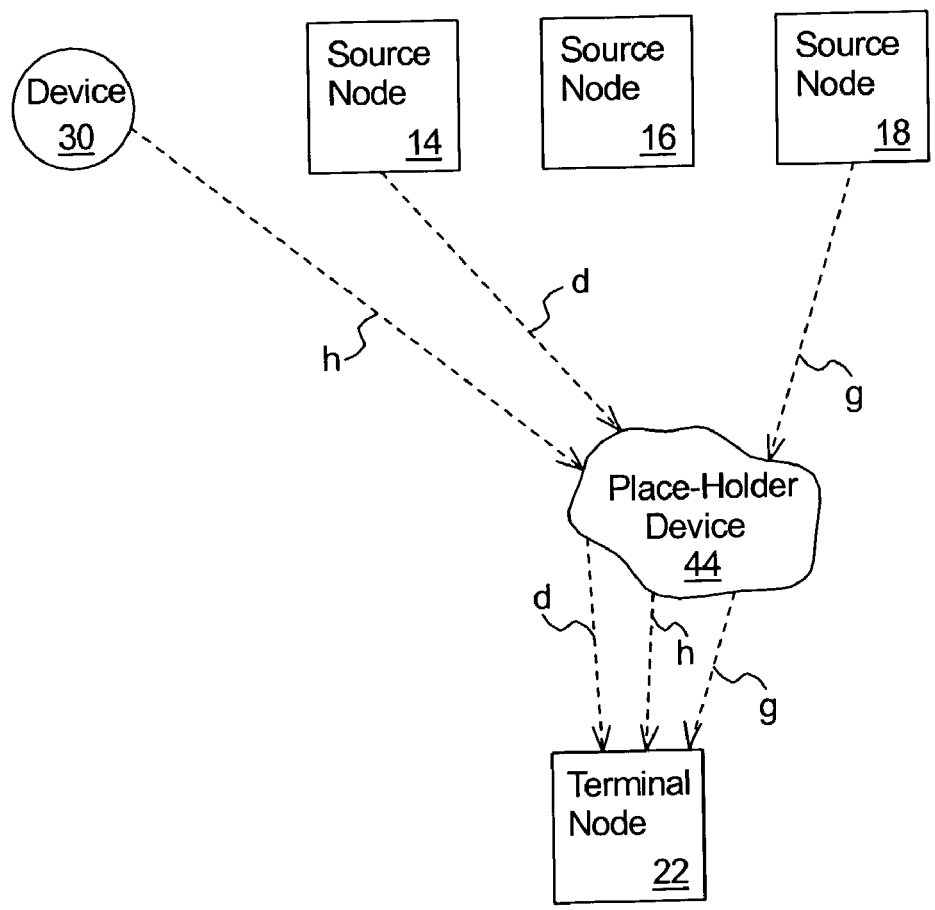
FIG. 10 shows the flow requirements of FIG. 9 and a device of the fabric design that has been recast as a source node according to an aspect of the present invention.
Figure 11:
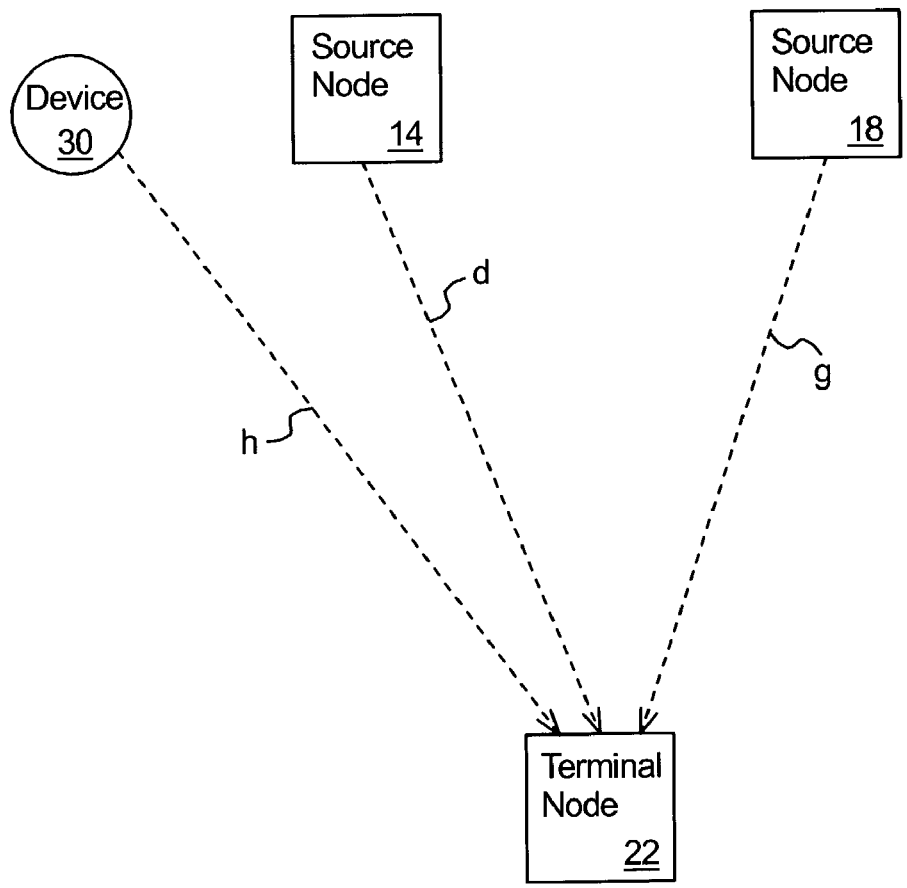
FIG. 11 shows flow requirements for a new portion of interconnect fabric to be added to the exemplary interconnect fabric design of FIG. 9 according to an aspect of the present invention.

In this example, device 30 may be recast as a source node for the purposes of solving the new design problem. This is shown in FIG. 10. For illustration purposes, the existing interconnect fabric design is omitted from FIG. 10. FIG. 11 shows flow requirements for a new portion of interconnect fabric to be added to the exemplary interconnect fabric design (to replace the placeholder device 44 of FIGS. 9 and 10). Thus, FIG. 11 shows a starting point for designing the new portion, as in step 108.

Figure 12:
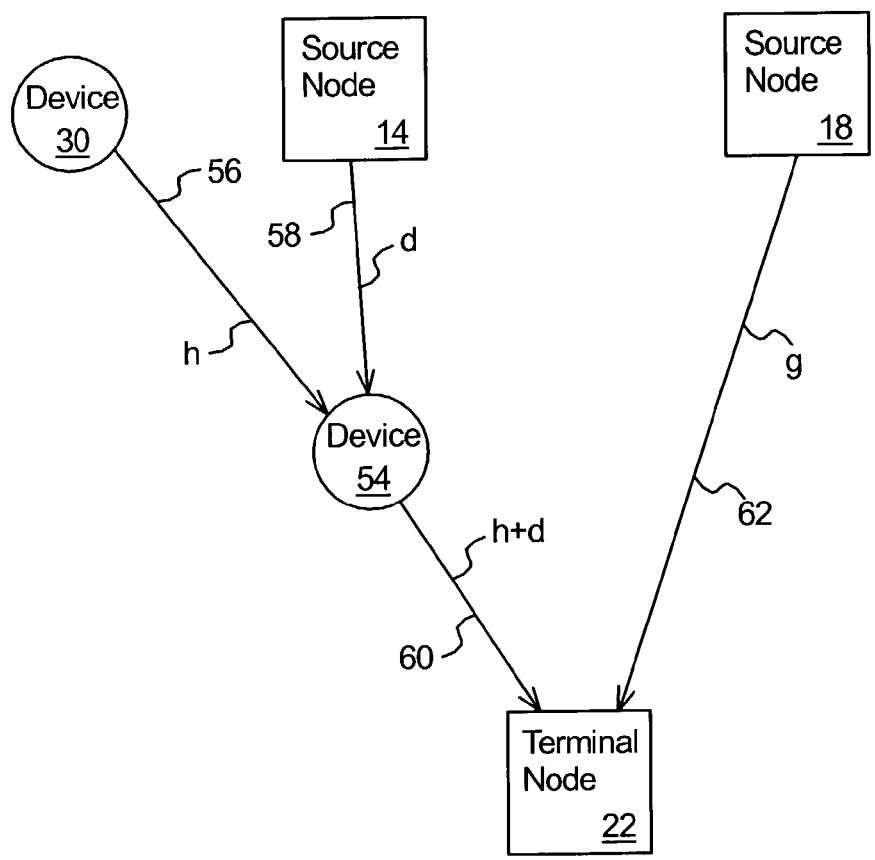
FIG. 12 shows an exemplary new portion of interconnect fabric to be added to the interconnect fabric design of FIG. 9 according to an aspect of the present invention.
Figure 13:
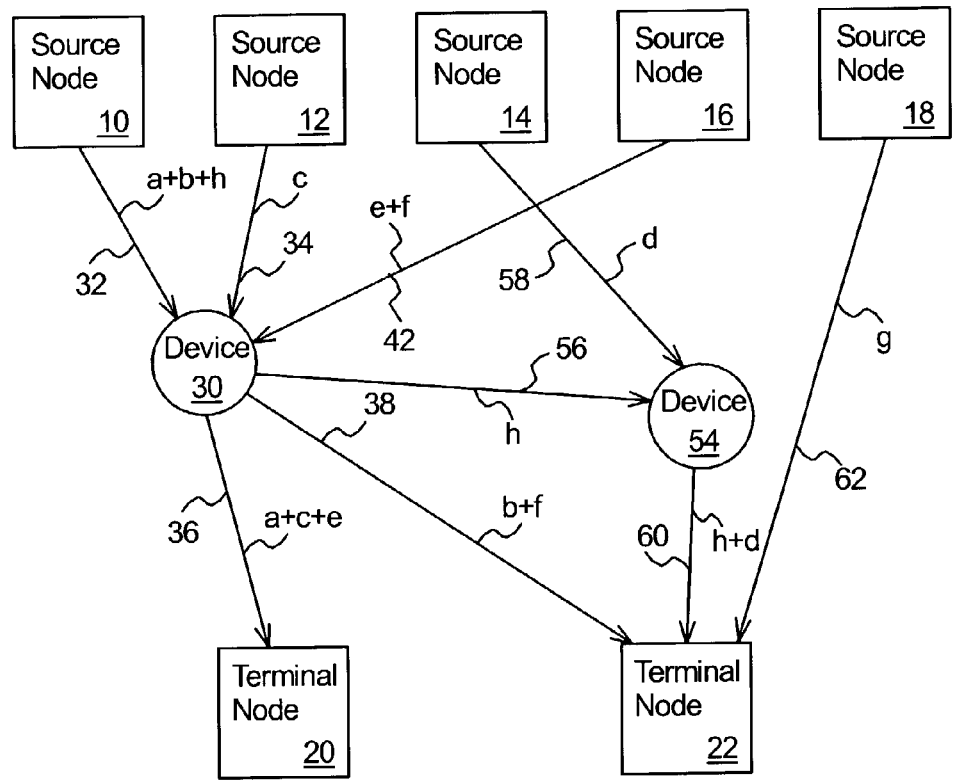
FIG. 13 shows the exemplary existing interconnect fabric design of FIG. 9 and the newly-added portion according to an aspect of the present invention.

FIG. 12 shows an exemplary new portion of interconnect fabric to be added to the interconnect fabric design as a result of step 108. As shown in FIG. 12, an interconnect device 54 and links 56, 58, 60 and 62 have been added. More particularly, device 30 (recast as a source node) is connected to device 54 by link 56; source node 14 is connected to device 54 by link 58; and device 54 is connected to terminal node 22 by link 60. Flow h is assigned to link 56, device 54 and link 60, flow d is assigned to link 58, device 54 and link 60 and flow g is assigned to link 62. FIG. 13 shows the exemplary interconnect fabric design of FIG. 9 including the new portion of FIG. 12. As shown in FIG. 13, the flow h passes from the existing design (which includes device 30) to the new portion (which includes device 54).

Thus, in the example of FIGS. 9-13, the device 30 functions as a source node with respect to the flow h. It will be apparent that in other examples, a device may be recast as a terminal node (where the device functions as a terminal node with respect to a flow). A difficulty arises, however, when an interconnect device functions as both a source and a terminal node.

Figure 14:
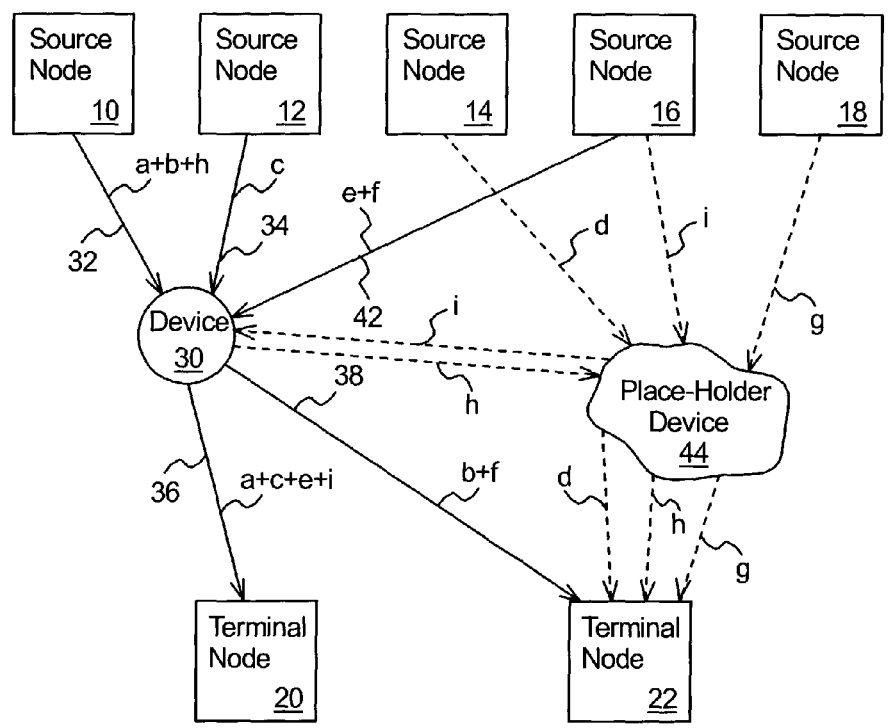
FIG. 14 shows an exemplary design specification for an interconnect fabric along with another new set of flow requirements to be supported by a reprovisioned design for the interconnect fabric according to an aspect of the present invention.

FIG. 14 shows an exemplary design specification for an interconnect fabric along with a different new set of flow requirements to be supported by a reprovisioned design for the interconnect fabric. The existing interconnect fabric design in FIG. 14 is the same as that of FIG. 9, however, the flow requirements differ in that flow i is added. The flow i connects source node 16 with terminal node 20.

Integer programming steps 102 and 104 of the method 100 (FIG. 1) are thus performed based on these new flow requirements (and based on the existing fabric design specification). In the solution to the integer programming problem as shown in FIG. 14, the flow h is partially assigned to the existing fabric design and partially assigned to the placeholder device 44 (as in FIG. 9). In addition, the flow i is partially assigned to the existing fabric design and partially assigned to the placeholder device 44. More particularly, the flow i is assigned to the link 30 and to the device 36 of the existing design which forms a path for the flow, but not a valid path since it does not originate at a source node for the flow. Assume, however, that the flow i cannot be assigned to the link 42 since this would violate a constraint (e.g., a bandwidth constraint). Thus, the flow i is connected from the terminal node 16 to the placeholder device 44 and from the placeholder device 44 to the device 30.

Figure 15:
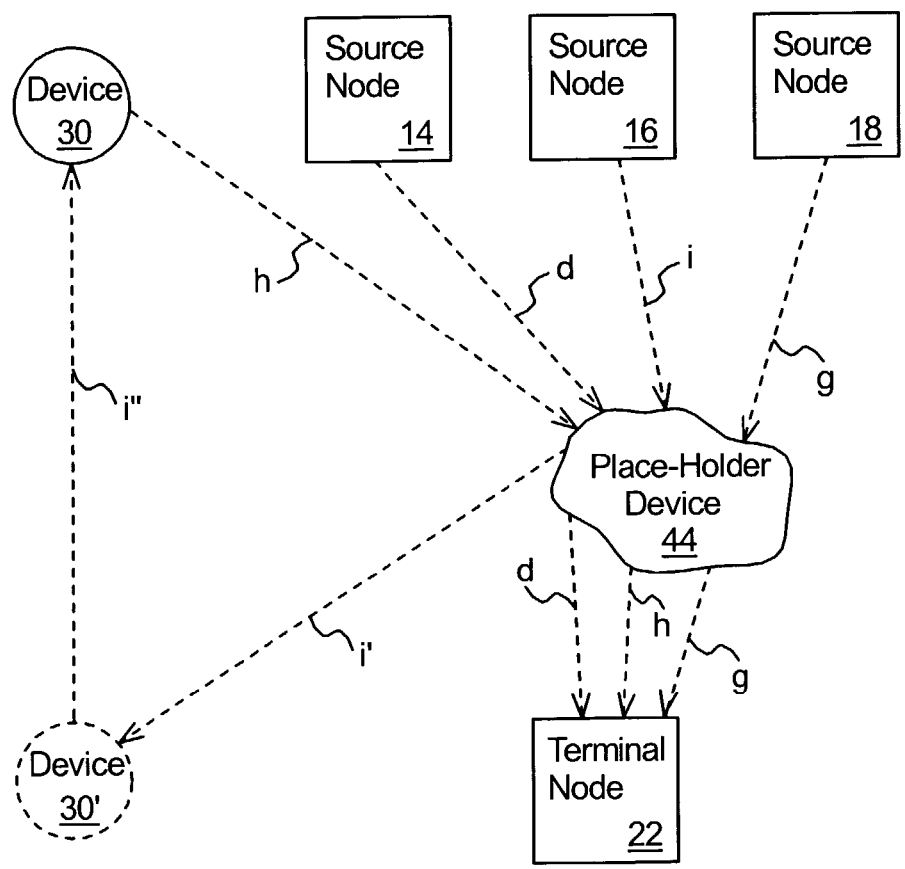
FIG. 15 shows the flow requirements of FIG. 14, along with a device of the fabric design that has been recast as a source node and a dummy node according to an aspect of the present invention.

Because the device 30 functions as a source node with respect to the flow h and as a terminal node with respect to the flow i, it is recast as a both a source node or terminal node. In one aspect, for performing step 108, one or more "dummy" nodes may be added to the design (e.g., in step 108) which function as source or terminal nodes for purposes of step 108, but which may then be removed from the design, as explained herein. FIG. 15 shows the addition of a dummy terminal node 30' to the exemplary interconnect fabric design for accommodating the flow i. Also, the device 30 is recast as a source node. Because the device 30 functions as a source node with respect to the flow h, the flow h is assigned to the device 30. Because the device 30 functions as a terminal node with respect to the flow i, the flow i is assigned to the dummy node 30'. More particularly, in FIG. 15, the flow i is replaced with two flows i' and i". The flow i' represents the portion of the flow i that connects from the placeholder device 44 to the device 30 (now device 30') while the flow i" represents a portion of the flow i that connects between the device 30' and the device 30' (so that the flow i can return to the device 30).

Alternately, the device 30 may be recast as a terminal node and the dummy device 30' may be added to function as a source node.

Figure 16:
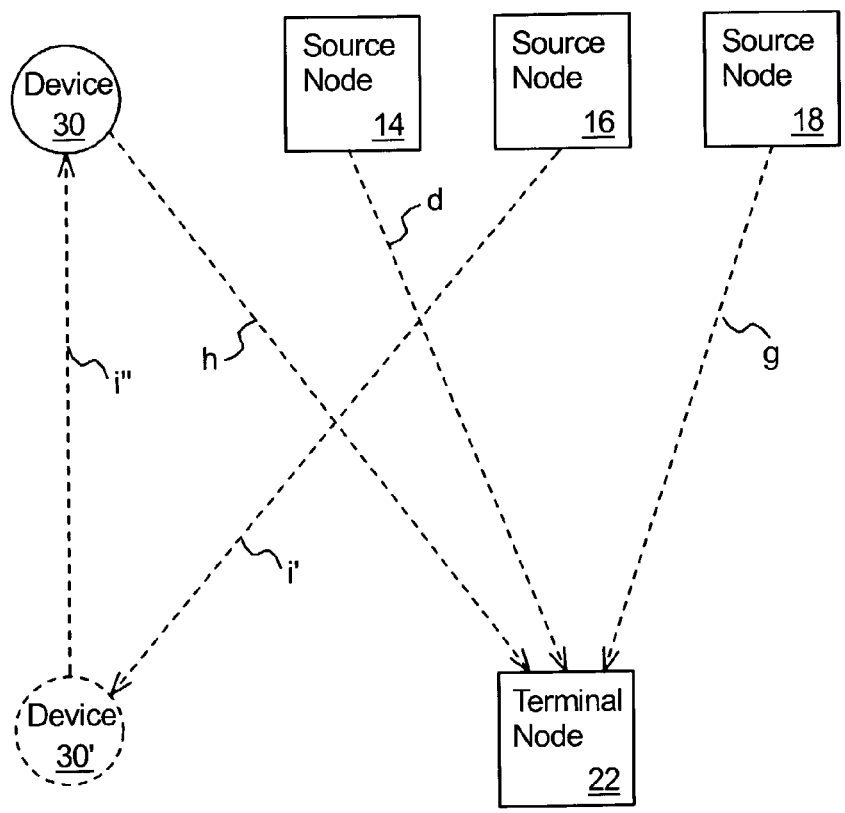
FIG. 16 shows flow requirements for a new portion of interconnect fabric to be added to the exemplary interconnect fabric design of FIG. 14 according to an aspect of the present invention.

FIG. 16 shows the flow requirements for a new portion of interconnect fabric to be added to the exemplary interconnect fabric design of FIG. 15 (to replace the placeholder device 44 of FIGS. 14 and 15). Thus, FIG. 16 shows a starting point for designing the new portion, as in step 108.

Figure 17:
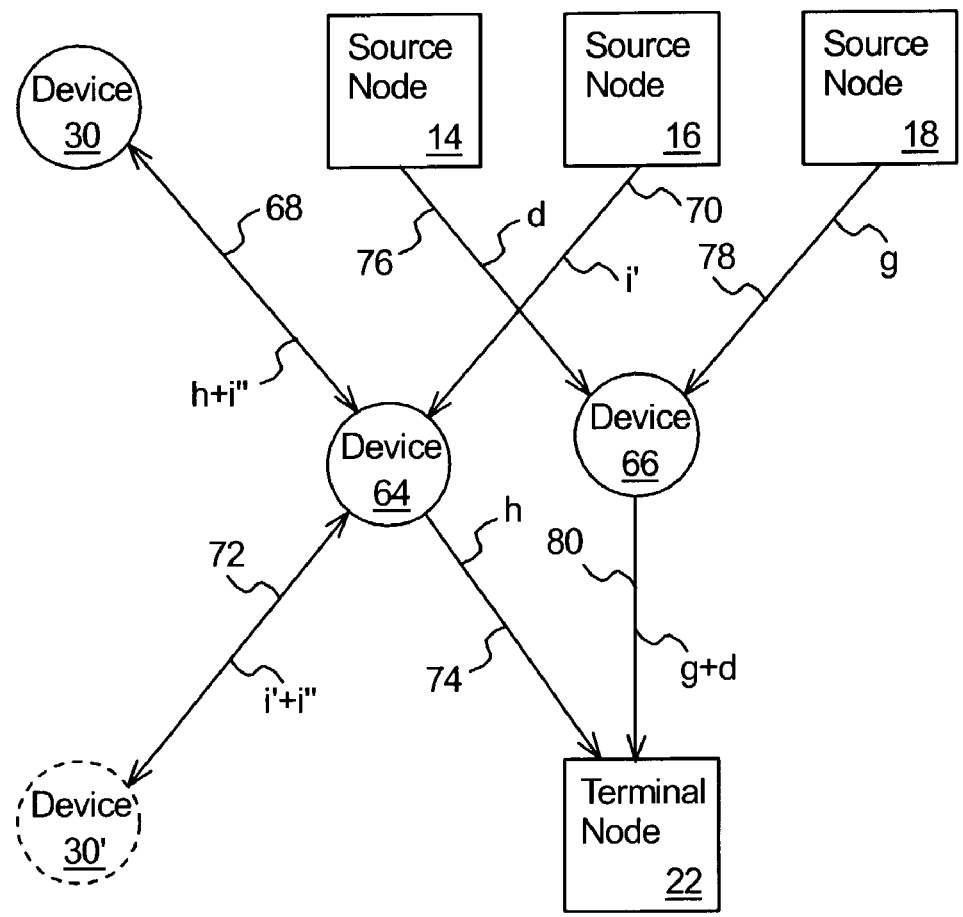
FIG. 17 shows an exemplary new portion of interconnect fabric to be added to the interconnect fabric design of FIG. 14 including the dummy node according to an aspect of the present invention.

FIG. 17 shows an exemplary new portion of interconnect fabric to be added to the interconnect fabric design as a result of step 108. As shown in FIG. 17, interconnect devices 64 and 66 have been added along with links 68, 70, 72, 74, 76, 78 and 80. More particularly, device 30 (recast as a source node) is connected to device 64 by link 68; source node 16 is connected to device 64 by link 70; device 64 is connected to dummy device 30' (cast as a terminal node) by link 72 and device 64 is connected to terminal node 22 by link 74. Source node 14 is connected to device 66 by link 76; source node 18 is connected to device 66 by link 78; and device 66 is connected to terminal node 22 by link 80. Flow h is assigned to link 68, device 64 and link 74; flow i' is assigned to link 70, device 64 and link 72; flow i" is assigned to link 72, device 64 and link 68; flow d is assigned to link 76, device 66 and link 80; and flow g is assigned to link 78, device 66 and link 80.

Figure 18:
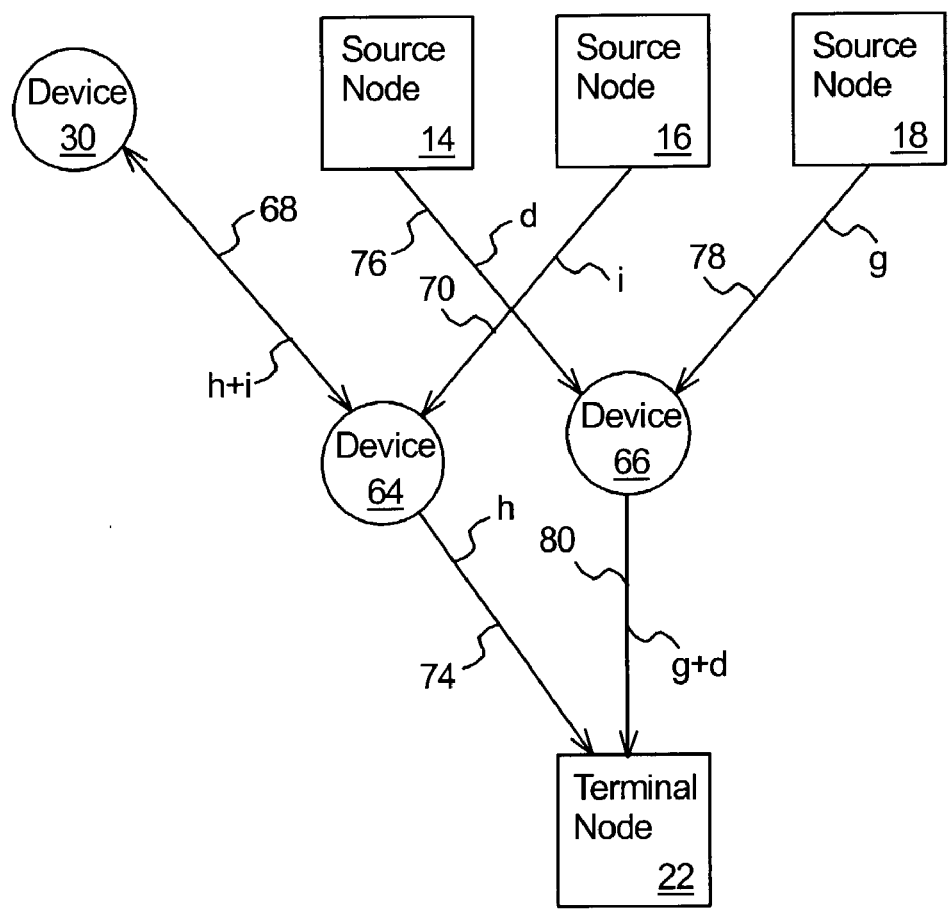
FIG. 18 shows an exemplary new portion of interconnect fabric to be added to the interconnect fabric design of FIG. 14 after removal of the dummy node according to an aspect of the present invention.

Once a design for the new portion has been obtained, the dummy node may be removed from the design. This may be accomplished by omitting the dummy node from the design and any links connected to the dummy node. FIG. 18 shows the exemplary new portion of interconnect fabric to be added to the interconnect fabric design of FIG. 14 after removal of the dummy node 30' and link 72. In addition, the flows i' and i" are renamed i.

As can be seen from FIG. 18, the link 68 routes the flow h from the node 30, while the link 68 also routes the flow i to the node 30. So that the dummy node can be removed without interfering with the remainder of the design, the dummy node should not be connected to any source or terminal nodes (nor to any interconnect devices recast as source or terminal nodes) via a direct link. In other words, an interconnect device should be the only device connected to the dummy node. This may be accomplished, for example, by assigning only a single port to the dummy node for purposes of constructing the new portion of fabric (as in step 108).

Figure 19:
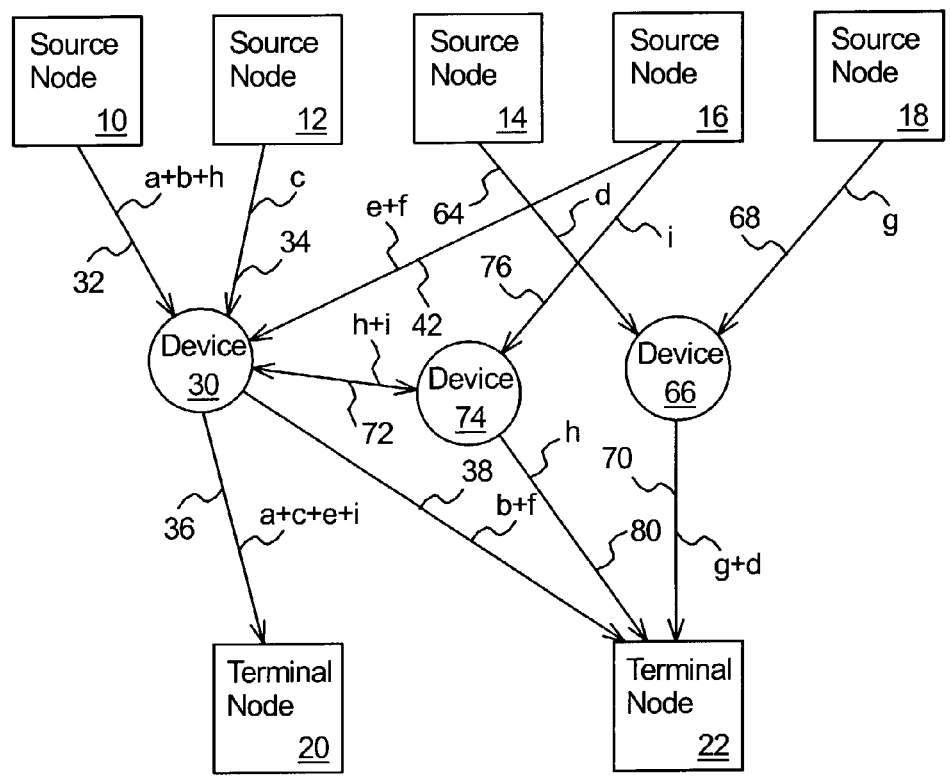
FIG. 19 shows the exemplary interconnect fabric design of FIG. 14 and the newly-added portion according to an aspect of the present invention.

FIG. 19 shows the exemplary interconnect fabric design of FIG. 14 including the new portion of FIG. 18. As shown in FIG. 19, the flows h and i pass between the device 30 of existing design and the new portion (and in opposite directions).

Thus, a technique has been described in which an original interconnect fabric design is reprovisioned for accommodating a new set of flow requirements where one or more flows pass from the original design to the newly-added portion.

Note that in the examples above, the interconnect devices may be switches. Accordingly, communications for a flow that pass through one of these devices are passed from an entry port of the device to a specified exit port of the device. For determining whether bandwidth constraints are violated for the integer programming problem (steps 102 and 104), the bandwidth requirements for all flows at the same input and exit ports are used to determine whether the maximum bandwidth capacity of either the input or exit port is exceeded. In addition, bandwidth requirements for all flows that enter the interconnect device may be used to determine whether the maximum bandwidth capacity of the device is exceeded.

For other devices, such as hubs or repeaters, communications for a flow that enters a port of the device may be repeated at all other ports of the device, not just a specified exit port as in the case of switches. As a result, bandwidth consumed at one port to receive communications is also consumed at each other port in order to retransmit the communications and, because the communications are retransmitted, bandwidth is consumed at other devices in the fabric that receive these communications. Accordingly, the bandwidth requirement for a flow entering such a device is considered along with the bandwidth requirements for all the other flows entering the device to determine whether the bandwidth capacity of any port is exceeded. In addition, other devices that receive the repeated communications are examined to determine whether their bandwidth capacity is exceeded.

Figure 20:
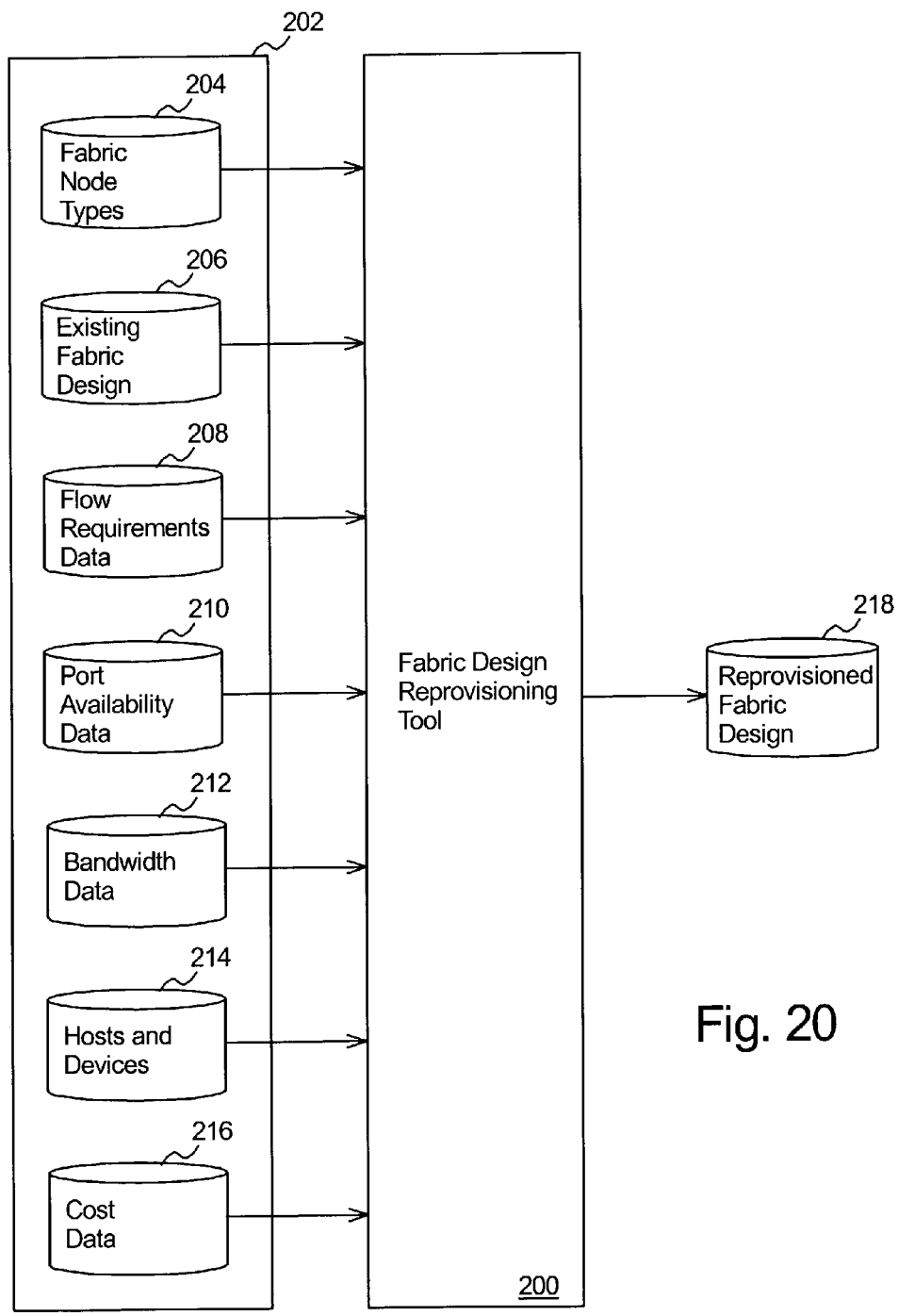
FIG. 20 shows a system having a fabric design reprovisioning tool that may be used to reprovision a design for an interconnect fabric in accordance with an aspect of the present invention.

FIG. 20 shows a system having a fabric design reprovisioning tool 200 that may employ the method 100 of FIG. 1 to reprovision a design for an interconnect fabric. The fabric design reprovisioning tool 200 may be implemented in computer software and/or hardware to perform its functions. Thus, the tool may include machine-readable media (e.g., a floppy disk, compact disk or hard disk) that includes a sequence of machine-executable instructions according to which the methods herein may be performed. Design information 202 input to the tool 200 in one embodiment includes a list of fabric node types 204, a interconnect specification for an existing design 206, a set of flow requirements data to be supported by the reprovisioned design 208, a set of port availability data 210, a set of bandwidth data 212, a list of hosts (source nodes) and devices (terminal nodes) 214, and cost data 216. The design information 202 may be stored in an information store, such as a file or set of files or a database, etc.

The list of fabric node types 204 may specify interconnect devices that are available for inclusion in the reprovisioned fabric design. For example, these may include switches and hubs.

The interconnect fabric design specification 206 may specify the original interconnect fabric design to be reprovisioned.

The flow requirements data 208 may specify the desired flow requirements for the reprovisioned interconnect fabric design 216. The desired flow requirements may include bandwidth requirements for each pairing of the source and terminal nodes. This data 208 may be represented as a table (e.g., Table 1 and Table 2).

The port availability data 210 may specify the number of communication ports available on each source node and each terminal node and each available interconnect device. This information may be used to determine feasibility of assigning flows to paths (e.g., in step 108 of FIG. 1) and for adding links (step 104 of FIG. 1).

The bandwidth data 212 may specify the bandwidth of each host and device port and each type of fabric node and link. The bandwidth data may also specify maximum bandwidth for entire interconnect devices. This information may also be used to determine feasibility of assigning flows to paths.

The list of hosts and devices 214 may specify the hosts and devices that are to be interconnected by a reprovisioned interconnect fabric design 216. This list 204 is, thus, related to the flow requirements data 208.

The cost data 216 may specify costs associated with adding links (e.g., according to length), interconnect devices and for reusing elements of the existing design fabric. This data 216 may be used in steps 102 and 104 for minimizing cost of the reprovisioned fabric design 216.

We could also have penalty data (for removing links, or not using pre-existing nodes, if we care about that.)

Reprovisioned fabric design result 216 generated by the fabric design reprovisioning tool 200 specifies a reprovisioned fabric design based on the original design 206 that is intended to satisfying the flow requirements 208.

The foregoing detailed description of the present invention is provided for the purposes of illustration and is not intended to be exhaustive or to limit the invention to the precise embodiment disclosed. Accordingly, the scope of the present invention is defined by the appended claims.

What is claimed is:

1. A computer implemented method for verifying and reprovisioning an initial design for an interconnect fabric, the method comprising:

initializing an integer programming problem with the initial design including an arrangement of interconnect elements for interconnecting a plurality of network nodes and with requirements for a plurality of flows among the network nodes, the interconnect elements including at least communication links and the integer programming problem being in terms of decision variables and constraints with at least one decision variable being an integer value that represents addition of a new link between a pair of the nodes;

solving the integer programming problem thereby forming a plurality of solutions, wherein in each solution, one or more of the flows is assigned to a path in the initial design, said solving comprising for at least one solution adding a new communication link to the initial design in a path for a flow, the adding of the new link being represented by the integer value; and selecting a solution according to an objective of maximizing assignment of flows to paths in the initial design.

2. The method according to claim 1, wherein said interconnect elements further comprise interconnect devices wherein each path includes a contiguous set of one or more interconnect elements from a source node to a terminal node.

3. The method according to claim 1, further comprising determining whether any flows remain unassigned.

4. The method according to claim 1, further comprising removing communication links in said initial design for which no flow is assigned.

5. The method according to claim 1, wherein said adding the new communication link further comprises selecting a pair of available ports including an available port that is reachable from the source node for the flow and one of the available ports that is reachable from the terminal node for the flow, wherein said new communication link is added between the selected available ports.

6. The method according to claim 1, further comprising assigning a cost value to each new link added to the design.

7. The method according to claim 6, further comprising removing communication links in said initial design for which no flow is assigned.

8. The method according to claim 7, further comprising assigning a cost penalty to a link removed from the design.

9. The method according to claim 6, wherein said selecting a solution selects a solution according to a cost minimization objective.

10. The method according to claim 9, wherein said selecting a solution selects a solution according to a weighted combination of maximizing assignment of flows and minimizing cost.

11. The method according to claim 9, wherein said selecting a solution selects a least-cost solution from among a plurality of solutions selected according to the objective of maximizing assignment of flows to the initial design.

12. The method according to claim 1, further comprising designing a new portion of the interconnect fabric to be added to the initial design where one or more flows cannot be accommodated by said initial design.

13. The method according to claim 12, wherein said designing the new portion comprises assigning a cost to interconnect elements of the initial interconnect fabric design to which no flows are assigned that is lower than a cost assigned to elements of the new portion that are not included in the original interconnect fabric.

14. The method according to claim 12, wherein at least one flow is assigned partially to the initial fabric design and partially to the new portion.

15. A computer implemented method for verifying and reprovisioning an initial design for an interconnect fabric, the method comprising:

initializing an integer programming problem with the initial design including an arrangement of interconnect elements for interconnecting a plurality of network nodes and with requirements for a plurality of flows among the network nodes;

solving the integer programming problem thereby forming a plurality of solutions, wherein in each solution, one or more of the flows is assigned to a path in the initial design;

selecting a solution according to an objective of maximizing assignment of flows to paths in the initial design; and designing a new portion of the interconnect fabric to be added to the initial design where one or more flows cannot be accommodated by said initial design, wherein said designing the new portion comprises recasting an interconnect device of the initial design as a source or terminal node for at least one of the flows that cannot be accommodated by said initial design.

16. The method according to claim 15, wherein said designing the new portion further comprises adding a dummy node wherein the dummy node serves as a source node when the recast interconnect device serves as a terminal node and the dummy node serves as a terminal node when the recast interconnect device serves as a source node.

17. The method according to claim 1, wherein said integer programming problem comprises a constraint that a flow can only be assigned to a path for the flow that starts at a source node for the flow, terminates at an end node for the flow and passes through a contiguous subset of the interconnect elements.

18. The method according to claim 17, wherein said integer programming problem comprises a further constraint that a flow can only be assigned to a path for which no bandwidth capacity is exceeded for the subset of interconnect elements.

19. A computer implemented method for reprovisioning an initial design for an interconnect fabric, the method comprising:

initializing an integer programming problem with the initial design including an arrangement of interconnect elements for interconnecting a plurality of network nodes and with requirements for a plurality of flows among the network nodes;

solving the integer programming problem thereby forming a plurality of solutions, wherein in each solution, one or more of the flows is assigned to a path in the initial design, and in at least one solution, one or more flows not assigned to a valid path in the initial design are assigned to a new portion of interconnect fabric and the at least one solution identifying entry and exit points for the one or more flows assigned to the new portion and routed between elements of the initial design and the new portion;

selecting a solution to the integer programming problem; and designing the new portion of interconnect fabric for accommodating the flows not assigned to a valid path in the initial design.

20. The method according to claim 19, where said solving further comprises assigning any flow not assigned to a valid path in the initial design to a placeholder device and wherein said new portion replaces the placeholder device.

21. The method according to claim 20, wherein said assigned flows are assigned according to a cost objective.

22. The method according to claim 21, wherein said selecting a solution selects a least-cost solution from among a plurality of solutions selected according to an objective of maximizing assignment of flows to paths in the initial design.

23. The method according to claim 20, wherein said placeholder device is functionally equivalent to a switching device that has an unlimited port count and unlimited bandwidth.

24. The method according to claim 23, wherein said assigned flows are assigned according to a cost objective.

25. The method according to claim 20, wherein decision variables associated with the placeholder device identify all exit and entry points for flows assigned to the new portion of interconnect fabric.

26. The method according to claim 19, wherein a valid path begins and a source node for the flow, terminates at a terminal node for the flow and passes through a contiguous subset of interconnect devices for the flow.

27. The method according to claim 19, wherein said interconnect elements comprise communication links and wherein solving further comprises adding a new communication link to the initial design in a path for a flow.

28. The method according to claim 27, wherein said adding the new communication link further comprises selecting a pair of available ports including an available port that is reachable from the source node for the flow and one of the available ports that is reachable from the terminal node for the flow, wherein said new communication link is added between the selected available ports.

29. The method according to claim 19, wherein at least one flow is assigned partially to the initial fabric design and partially to the new portion.

30. The method according to claim 29, wherein said designing the new portion comprises recasting an interconnect device of the initial design as a source or terminal node for at least one of the partially assigned flows.

31. The method according to claim 30, wherein said designing the new portion further comprises adding a dummy node wherein the dummy node serves as a source node when the recast interconnect device serves as a terminal node and the dummy node serves as a terminal node when the recast interconnect device serves as a source node.

* * * * *